(12) United States Patent
Ipek et al.

(10) Patent No.: US 8,255,742 B2
(45) Date of Patent: Aug. 28, 2012

(54) DYNAMICALLY REPLICATED MEMORY

(75) Inventors: Engin Ipek, Redmond, WA (US); Jeremy P. Condit, Redmond, WA (US); Edmund B. Nightingale, Redmond, WA (US); Douglas C. Burger, Redmond, WA (US); Thomas Moscibroda, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 463 days.

(21) Appl. No.: 12/621,419

(22) Filed: Nov. 18, 2009

(65) Prior Publication Data

US 2011/0119538 A1    May 19, 2011

(51) Int. Cl.
*G06F 11/00*    (2006.01)
*G11C 29/00*    (2006.01)

(52) U.S. Cl. ...... 714/6.13; 714/710; 714/718; 714/6.32; 714/25; 714/30; 714/42; 365/200; 365/201

(58) Field of Classification Search ............... 714/6.13, 714/6.32, 25, 30, 42, 710, 718; 365/200, 365/201

See application file for complete search history.

(56) References Cited

U.S. PATENT DOCUMENTS

| | | | |
|---|---|---|---|
| 4,547,882 A | | 10/1985 | Tanner |
| 5,553,231 A | | 9/1996 | Papenberg et al. |
| 5,553,263 A | | 9/1996 | Kalish et al. |
| 5,588,112 A | | 12/1996 | Dearth et al. |
| 5,729,714 A | * | 3/1998 | Dei ................... 711/147 |
| 5,883,842 A | * | 3/1999 | Miyauchi ............. 365/200 |
| 6,263,452 B1 | | 7/2001 | Jewett et al. |
| 6,381,682 B2 | * | 4/2002 | Noel et al. .............. 711/153 |
| 7,107,411 B2 | | 9/2006 | Burton et al. |
| 7,434,100 B2 | | 10/2008 | Hogdal et al. |
| 7,511,646 B2 | * | 3/2009 | Cornwell et al. ......... 341/126 |
| 7,543,177 B2 | | 6/2009 | Bullen et al. |
| 7,581,152 B2 | | 8/2009 | Mukherjee et al. |
| 2005/0193283 A1 | | 9/2005 | Reinhardt et al. |
| 2007/0101094 A1 | * | 5/2007 | Thayer et al. .............. 711/202 |
| 2008/0275928 A1 | | 11/2008 | Shuster |
| 2009/0073739 A1 | | 3/2009 | Bartley et al. |

OTHER PUBLICATIONS

Christodoulopoulou, et al., "Dynamic Data Replication: an Approach to Providing Fault-Tolerant Shared Memory Clusters", retrieved on May 25, 2010 at <<http://www.eecg.toronto.edu/~azimi/publications/ftsvm2.pdf>>, Proceedings of Symposium on High Performance Computer Architecture (HPCA-9), Anaheim, CA, Feb. 2003, pp. 1-12.

Condit, et al., "Better I/O Through Byte-Addressable, Persistent Memory", retrieved on May 25, 2010 at <<ftp://ftp.cs.utexas.edu/pub/dburger/papers/SOSP09.pdf>>, ACM, Proceedings of Symposium on Operating Systems Principles (SOSP), Big Sky, MT, Oct. 2009, pp. 133-146.

Dyer, et al., "The Average Performance of the Greedy Matching Algorithm", retrieved on May 25, 2010 at <<http://citeseerx.ist.psu.edu/viewdoc/download;jsessionid=C308F0FAD0E81DF3570CDACC5DC3C8B9?doi=10.1.1.43.7442&rep=rep1&type=pdf>>, The Annals of Applied Probability, vol. 3, No. 2, 1993, pp. 526-552.

(Continued)

*Primary Examiner* — John J Tabone, Jr.
(74) *Attorney, Agent, or Firm* — Lee & Hayes, PLLC

(57) ABSTRACT

Dynamically replicated memory is usable to allocate new memory space from failed memory pages by pairing compatible failed memory pages to reuse otherwise unusable failed memory pages. Dynamically replicating memory involves detecting and recording memory faults, reclaiming failed memory pages for later use, recovering from detected memory faults, and scheduling access to replicated memory pages.

18 Claims, 18 Drawing Sheets

OTHER PUBLICATIONS

Edmonds, "Paths, Trees, and Flowers" (Review), retrieved on May 25, 2010 at <<http://nvl.nist.gov/pub/nistpubs/sp958-lide/140-144.pdf>>, Canadian Journal of Mathematics, vol. 17, 1965, pp. 449-467.

Gericota, et al., "Dynamic Replication: The Core of a Truly Non-Intrusive SRAM-based FPGA Structural Concurrent.Test Methodology", retrieved on May 25, 2010 at <<http://citeseerx.ist.psu.edu/viewdoc/download?doi=10.1.1.5.5962&rep=rep1&type=pdf>>, IEEE Latin American Test Workshop, Montevideo, UY, Feb. 2002, pp. 70-75.

"International Technology Roadmap for Semiconductors", retrieved on May 26, 2010 at <<http://www.itrs.net/>>, ITRS, 2009, pp. 1-2.

Lee, et al., "Architecting Phase Change Memory as a Scalable DRAM Alternative", retrieved on May 25, 2010 at <<ftp://ftp.cs.utexas.edu/pub/dburger/papers/ISCA09.pdf>>, ACM, Proceedings of International Symposium on Computer Architecture (ISCA), Austin, TX, Jun. 2009, pp. 2-13.

Micali, et al., "An 0(v|v|c|E|) Algorithm for Finding Maximum Matching in General Graphs", IEEE Computer Society, In the 21st Annual Symposium on Foundations of Computer Science, 1980, pp. 17-27.

Micheloni, et al., "Error Correction Codes for Non-Volatile Memories", Springer, Jun. 9, 2008, 77 pages.

"Micron. 512Mb DDR2 SDRAM Component Data Sheet: MT47H128M4B6-25", retrieved on May 25, 2010 at <<http://download.micron.com/pdf/datasheets/dram/ddr2/512MbDDR2.pdf>>, Micron Technology, Inc., 2004, pp. 1-129.

Mitzenmacher, "The Power of Two Choices in Randomized Load Balancing", retrieved on May 25, 2010 at <<http://www.eecs.harvard.edu/~michaelm/postscripts/mythesis.pdf>>, University of California, Berkeley, Doctoral Thesis, 1996, pp. 1-127.

Qureshi, et al., "Enhancing Lifetime and Security of PCM-Based Main Memory with Start-Gap Wear Leveling", ACM, In the Proceedings of the 42nd Annual IEEE/ACM International Symposium on Microarchitecture, Session: Memory System, 2009, pp. 14-23.

Qureshi, et al., "Scalable High Performance Main Memory System Using Phase-Change Memory Technology", retrieved on May 25, 2010 at <<http://users.ece.utexas.edu/~qk/papers/pcm.pdf>>, ACM, Proceedings of International Symposium on Computer Architecture (ISCA), Austin, TX, 2009, pp. 1-10.

Raoux, et al., "Phase-change random access memory: A scalable technology", retrieved on May 25, 2010 at <<http://www.signallake.com/innovation/raoux.pdf>>, IBM Journal of Research and Development, vol. 52, No. 4, 2008, pp. 465-479.

"SESC: cycle accurate architectural simulator", retrieved on May 26, 2010 at <<http://sesc.sourceforge.net/>>, SESC Mailing List, 2005, pp. 1.

Soundararajan, "Flexible Use of Memory for Replication/Migration in Cache-Coherent DSM Multiprocessors", retrieved on May 25, 2010 at <<ftp://db.stanford.edu/pub/cstr/reports/csl/tr/99/789/CSL-TR-99-789.pdf>>, Stanford University, Technical Report: CSL-TR-99-789, Nov. 1999, pp. 1-143.

Wu, et al., "Hybrid Cache Architecture with Disparate Memory Technologies", retrieved on May 25, 2010 at <<http://dmclab.hanyang.ac.kr/wikidata/lectures/2009_FALL_SS/2_16.pdf>>, ACM, Proceedings of International Symposium on Computer Architecture (ISCA), Austin, TX, 2009, pp. 34-45.

Zhang, et al., "Exploring Phase Change Memory and 3D Die-Stacking for Power/Thermal Friendly, Fast and Durable Memory Architectures", retrieved on May 26, 2010 at <<http://74.125.155.132/scholar?q=cache:5WOfrGeJl98J:scholar.google.com/&hl=en&as_sdt=2000>>, Proceedings of International Conference on Parallel Architectures and Compilation Techniques (PACT-18), Sep. 2009, pp. 1-13.

Zhou, et al., "A Durable and Energy Efficient Main Memory Using Phase Change Memory Technology", retrieved on May 25, 2010 at <<http://www.multicoreinfo.com/research/papers/2009/isca09-02-zhou-durable.pdf>>, ACM, Proceedings of International Symposium on Computer Architecture (ISCA), Austin, TX, 2009, pp. 1-10.

Zhou, et al., "Maximum matching on random graphs", retrieved on May 25, 2010 at <<http://arxiv.org/PS_cache/cond-mat/pdf/0309/0309348v1.pdf>>, EDP Sciences, Europhysics Letters, Sep. 15, 2003, pp. 1-17.

* cited by examiner

DYNAMICALLY REPLICATED MEMORY

This application is related to concurrently-filed U.S. patent application Ser. No. 12/621,396 entitled "Improving Efficiency of Hardware Memory Access using Dynamically Replicated Memory," and is incorporated herein by reference.

BACKGROUND

For many years, dynamic random access memory (DRAM) has served as a fundamental building block in computer memory sub-systems. Over this time, memory capacity has significantly increased, with a correspondingly significant reduction in memory chip size. Such DRAM scaling has led to significant increases in the memory capacities of computer devices and an ever increasing number of portable devices. However, memory scaling is not without its problems.

As scaling increases, semiconductor memories reach densities at the atomic level. Unfortunately, at this level individual atoms and electrons likely have negative effects on data storage correctness. Potentially, incorrect data storage could lead to the end of DRAM scaling. In response, the memory chip industry may soon turn its attention to resistive-memory technologies such as phase-change memory (PRAM). PRAM is one of the most promising technologies to potentially replace DRAM because functional PRAM prototypes have been demonstrated at 22 nm, and they are projected to scale to 9 nm. Eventually, it is possible that PRAM, or other types of resistive memories, will replace most of the semiconductor memories, including those residing on the memory bus.

Currently, PRAM's greatest limiting factor is its write endurance. At the 65 nm technology node, a PRAM cell is expected to sustain $10^8$ writes before the cell's heating element breaks and induces a stuck-at fault (or hard failure), where writes are no longer able to change the value stored in the cell. Moreover, as PRAM scales to near-atomic dimensions, variability across device lifetimes increases, causing many cells to fail much sooner than in systems with lower variations. Unfortunately, existing systems for managing hard failures in DRAM and flash memory technologies do not map easily to PRAM. Accordingly, there is a need for low-overhead, accurate detection of hard failures, and a simple hardware-software interface that provides lossless recovery from such failures.

BRIEF SUMMARY

This summary is provided to introduce simplified concepts for dynamically replicating memory, which is further described below in the Detailed Description. This summary is not intended to identify essential features of the claimed subject matter, nor is it intended for use in determining the scope of the claimed subject matter. Generally, dynamically replicating memory involves detecting and recording memory faults, reclaiming failed memory pages for later use, recovering from detected memory faults, and scheduling access to replicated memory.

In one aspect, memory faults may be detected by writing data to a location of memory and then reading from the same location in memory. The written data is compared to the read data to determine if they match, and a parity bit is set such that an even number of "1"s exists in the block. If an error is detected in the block, yet the error is not signified by the parity bit, an additional bit is intentionally flipped to achieve the desired inconsistency.

In another aspect, failed memory pages may be reclaimed by discovering a failed location in memory and dynamically allocating new memory space to replace the failed location. This new memory space is allocated by pairing two or more compatible failed memory pages that do not contain failures in the same respective locations.

In another aspect, recovery from a memory fault may be accomplished by maintaining a ready list that contains the addresses of the newly available memory pages. The data intended for the failed memory page may then be written to the new memory pages.

In yet another aspect, access to replicated memory pages may be scheduled such that a memory access request is received from a memory controller, the memory access request is placed in a transaction queue, the data of both replicated memory pages are accessed, and the data from one of the pages is stored in memory or data from memory is stored in both of the replicated memory pages.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Figure 1:
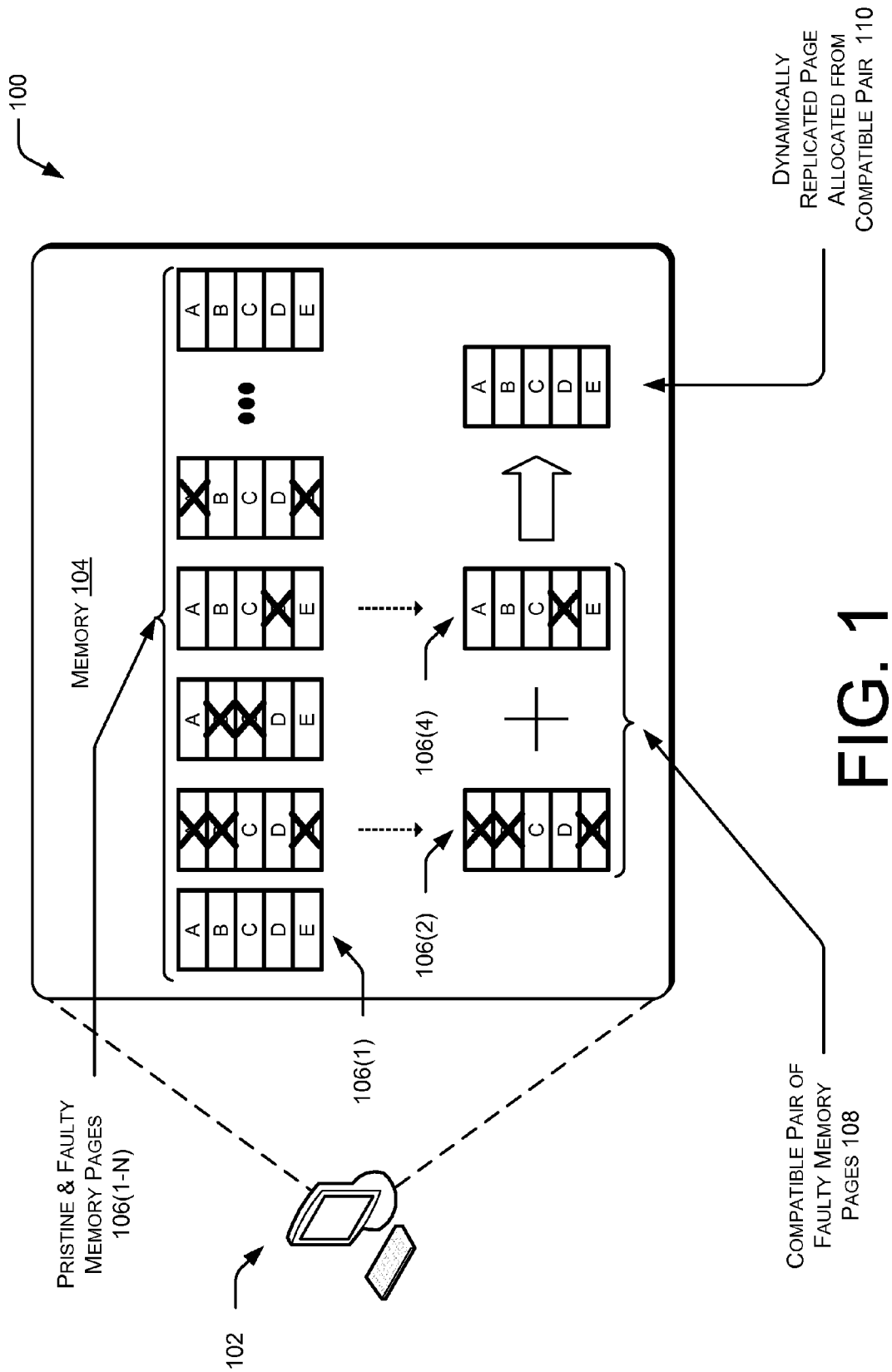
FIG. 1 is a schematic diagram of an illustrative system for dynamically replicating memory in order to allocate new memory space.

This disclosure describes detection of and recovery from hardware memory failures. In particular, a hard failure detection mechanism is used to find the failures and then memory is dynamically replicated to allow for a graceful degradation of memory capacity.

As discussed above, PRAM is write-limited. That is, PRAM cells can only correctly record data up to a certain number of data writes. For example, at the 65 nm technology node, a PRAM cell is only expected to sustain $10^8$ writes before the cell's heating element breaks and induces a stuck-at fault, where writes are no longer able to change the value stored in the PRAM cell. This limitation could potentially lead to large-scale capacity problems in computer systems of all types. This is because, historically, when a bit failure occurs on a PRAM page that error-correcting code (ECC) cannot handle, the entire page will be decommissioned. Over the life of a computer device, this could translate to significant memory capacity reduction.

The techniques described in this disclosure solve the above problems by accurately detecting, and reliably recording memory failures, dynamically replicating memory to reclaim faulty memory pages for reuse, and gracefully recovering from detected memory faults without losing data. Additionally, a method of efficiently accessing replicated memory is disclosed that delivers better performance than for a baseline, unreplicated system.

For memory failure detection and recording, a low-overhead mechanism is used that leverages PRAM's failure modes and timing constraints. The mechanism works regardless of the bit failure rate or the number of errors in each data block as long as checker-reads exist in the system. More specifically, a parity bit is set during every data write such that the number of "1"s in each codeword (i.e., the data block and parity bit combined) is always even, and a data read is performed after every data write (a checker-read). Furthermore, if an error is detected during the checker-read, and the parity bit has failed to signal the failure, an additional bit is intentionally flipped and the data is rewritten. Accordingly, failures are recorded by the parity bit as well. Additionally any parity scheme may be used to detect memory failures including odd parity, mark parity, space parity, or any other parity known. Other, non-parity based, forms of memory failure detection may also be suitable.

Correct bits in pages with faulty cells can be reclaimed by the process of dynamic memory replication. One way to accomplish this task is to pair faulty memory pages together that contain failed memory blocks in different respective locations. For example, a memory page with a faulty bit in the first block can be paired with a memory page containing a faulty bit in the second block. As long as the two, or more, memory pages can combine to represent one fault-free memory page, and each block of memory can be represented fault-free, memory can be replicated. To achieve this, a pairing algorithm is used to determine compatible faulty memory pages, and pair them with one another. This pairing is maintained via a new level of indirection. In addition to virtual and physical pages, we now add "real" pages. A physical page can map to a single "real" page if it has no errors, or it can map to two faulty-but-compatible "real" pages. This mapping is stored in a single physical-to-real table. In other words, as before, a virtual-to-physical table is used for each process.

Once an unrecoverable hard fault is detected, a memory controller will initiate recovery by copying the data to a new location in memory. In one example, to accomplish this task, the memory controller will make use of a ready table, which is the primary point of communication between the operating system and the memory controller. The ready table contains a list of real pages (or real page pairs) that the memory controller can use when a failure occurs; it also contains a list of failed pages for the operating system to handle. The ready table functions as a buffer that allows the memory controller and the operating system to exchange pages. Data intended for a faulty page can be written to a pristine page, or a compatible pair (or compatible set) of pages from the ready table. Faulty pages are temporarily placed in the ready table for later pairing, and newly formed compatible pairs are placed in the ready table for use as replicated memory. A compatible set of pages in this context refers to pages that have at least one non-faulty bit in all positions, or at least one bit in every position whose value is recoverable using ECC.

Accesses to primary and backup pages can be scheduled in at least two different ways: a "lazy" replication policy or an "eager" replication policy. Under the "lazy" replication policy, data reads (or writes) of the primary and backup pages take place sequentially. That is, the data access of the backup page is not executed until after the data access of the primary page is complete. This way, the access to the backup page may not need to be executed in case the access was to a non-faulty block of the primary memory page. Under the "eager" replication policy, data access to the primary and backup pages take place in parallel, with one access being canceled as soon as the first read (or checker-read following a write) returns with fault-free data.

FIG. 1 is a schematic diagram illustrating a high-level overview of a dynamic memory replication system 100 employed in an illustrative computer system 102. Memory 104 resides on computer system 102 and contains memory pages 106(1), 106(2) . . . 106(N) (collectively 106(1-N)). Memory pages 106(1-N) are made up of a mixture of pristine (non-faulty) memory pages and faulty memory pages. For example, memory page 106(1) is a pristine memory page as it has no faulty blocks, whereas faulty memory pages 106(2-5) each have at least one faulty block within the respective memory page. In this context, a faulty block is a memory block with a fault that ECC cannot correct, rather than a memory block with a fault that is correctible without page-pairing. More specifically, memory page 106(2) has hard faults at memory block locations A, B, and E, memory page 106(3) has hard faults at memory block locations B and C, memory page 106(4) has a hard fault at memory block location D only, and memory page 106(5) has hard faults at memory block locations A and E.

Under a dynamically replicated memory system 100, two or more faulty memory pages can be paired to reclaim memory space by representing one non-faulty memory page 110. As seen in FIG. 1, memory pages 106(2) and 106(4) are a compatible pair of faulty memory pages 108, and can be paired to form a dynamically replicated page allocated from a compatible pair 110.

Figure 2:
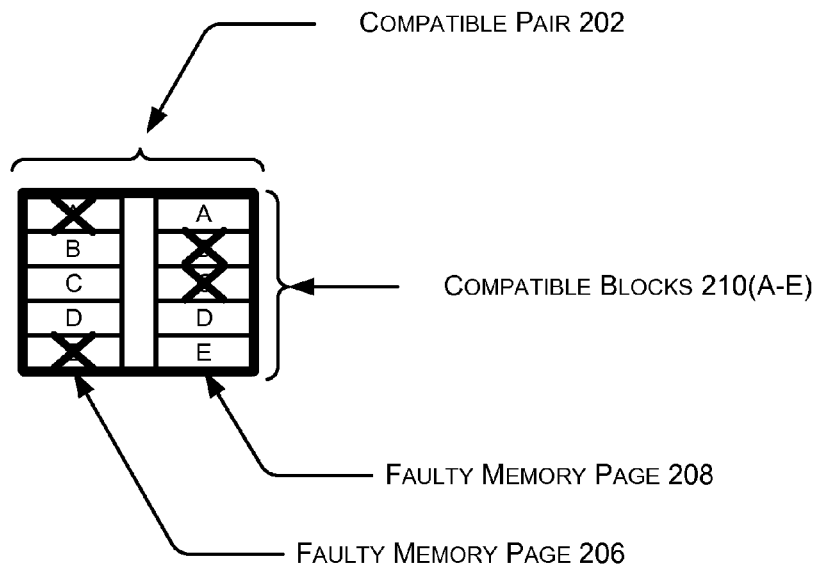
FIG. 2 is a schematic diagram of illustrative compatible and incompatible pairs of faulty memory pages.
Figure 2:
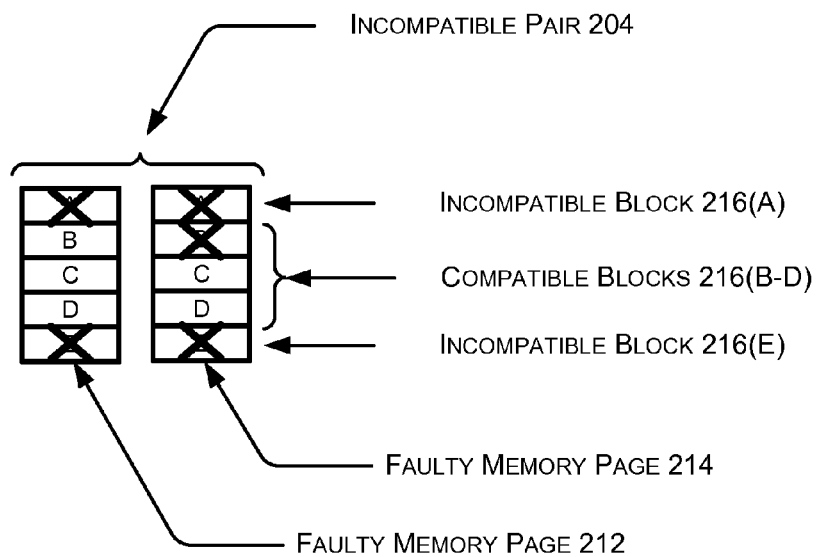

FIG. 2 is a schematic diagram further illustrating a compatible pair of memory pages 202 and an incompatible pair of memory pages 204. In this example, compatible pair 202 is made up of two faulty memory pages, faulty memory page 206 and faulty memory page 208. Each faulty memory page contains memory blocks A-E. Faulty memory page 206 and faulty memory page 208 form compatible pair 202 because all blocks are compatible blocks 210(A-E). In other words, compatible block 210(A) is compatible because at least one of faulty memory pages 206 and 208 contains a non-faulty block at location A. As seen in FIG. 2, this is true for every block location in compatible pair 202. As discussed above with reference to FIG. 1, by mapping the two faulty pages 206 and 208 together, also represented as compatible pair 202, one real page 110 can be represented as a dynamically replicated page allocated from the compatible pair. In this way, two otherwise unusable memory pages 206 and 208 can be reused to form one usable memory page. Similarly, referring back to FIG. 1, two otherwise unusable memory pages 106(2) and 106(4) can be reused to form one dynamically replicated page allocated from a compatible pair 110 of faulty memory pages.

FIG. 2 also illustrates an incompatible pair of memory pages 204. In this example, incompatible pair 204 is made up of two faulty memory pages, 212 and 214, each containing memory blocks A-E. Faulty memory page 212 and faulty memory page 214 form incompatible pair 204 because not all blocks are compatible. For example, blocks 216(B-D) are compatible; however, both blocks 216(A) and 216(E) are incompatible because they both contain faults at the same block. Although memory pages 212 and 214 contain some compatible blocks 216(B-D), not all blocks are compatible for the pair. In other words, not every block in incompatible pair 204 can be represented by at least one of the faulty memory pages 212 and 214. If incompatible pair 204 was used to represent one dynamically replicated page allocated from a compatible pair 110, from FIG. 1, the data written to both incompatible blocks 216(A) and 216(E) would not be recoverable. On the other hand, if compatible pair 202 was used to represent one dynamically replicated page allocated from a compatible pair 110, the data written to every compatible block 210(A-E) would be recoverable.

Figure 3:
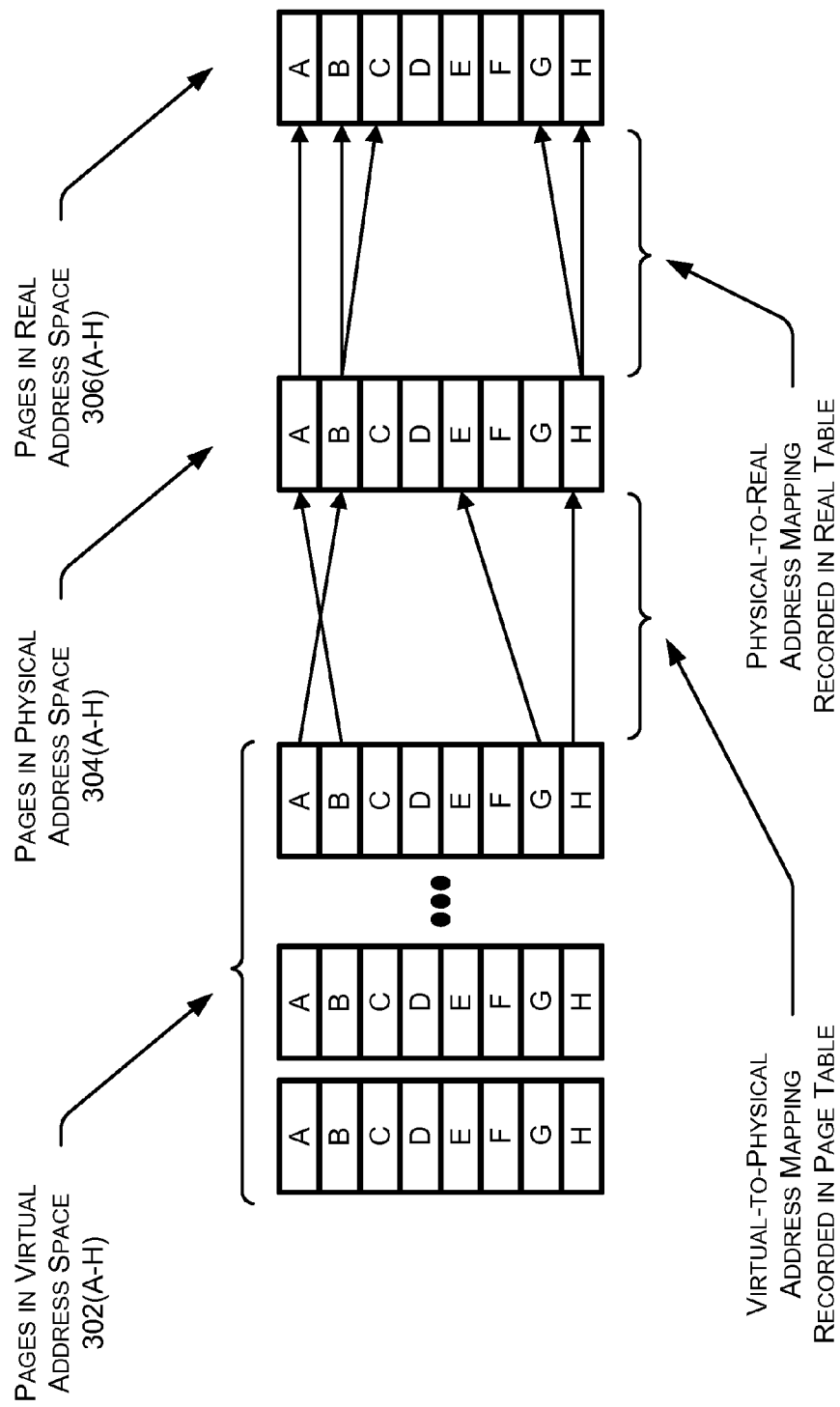
FIG. 3 is a schematic diagram of an illustrative dynamically replicated physical address space created with a physical-to-real address mapping.

FIG. 3 is a schematic diagram illustrating the two levels of indirection referenced above. In one aspect, memory pages in virtual address space 302(A-H) are mapped many-to-one, or one-to-one to memory pages in physical address space 304(A-H). For example only, and not by way of limitation, FIG. 3 illustrates virtual page 302(A) mapping to physical page 304(B), virtual page 302(B) mapping to physical page 304(A), virtual page 302(G) mapping to physical page 304(E), and virtual page 302(H) mapping to physical page 302(H). These virtual-to-physical address mappings are recorded in a page table, discussed in further detail below. Virtual-to-physical mappings are maintained separately for each process running on the computer. In another aspect, memory pages in physical address space 304(A-H) are mapped one-to-one, one-to-two, or one-to-many to memory pages in real address space 306(A-H). For example only, and not by way of limitation, FIG. 3 illustrates physical page 304(A) mapping, one-to-one, to real page 306(A); physical page 304(B) mapping, one-to-two, to real pages 306(B) and 306(C); and physical page 304(H) mapping, one-to-two, to real pages 306(G) and 306(H). In this example, real pages 306(B) and 306(C) correspond to the compatible pair dynamically replicated to represent physical page 304(B). Additionally, these physical-to-real address mappings are recorded in a real table, discussed in further detail below. Unlike the virtual-to-physical mappings, there is a single physical-to-real mapping shared by all processes. In one aspect, the memory replication can occur immediately at start-up, replicating every memory page, or can be implemented dynamically, after each hard fault is detected.

FIGS. 1, 2, and 3 provide simplified examples of suitable memory architectures according to the present disclosure. However, other architectures and configurations are also possible. For example, while memory pages are shown and described as having five memory block locations (e.g., blocks A-E in FIG. 1), memory pages having greater or fewer memory blocks may also be used. Additionally, while an address space has been shown including eight memory pages (e.g., pages A-H in FIG. 3), in practice, address spaces (virtual, physical, and real) may contain more or less memory pages than shown.

While dynamically replicated memory systems and methods are described in the context of PRAM, the concepts described herein are broadly applicable to computer systems employing other types of memory hardware or architecture. For example, dynamically replicated memory may be advantageous for use with main memory, cache memory, and RAM subsystems, as well as with all types of resistive memory type chips, including: PRAM, Spin-Torque Transfer Magnetoresistive RAM (STT-MRAM), Ferroelectric RAM (FRAM), and Resistive RAM (RRAM) such as memristors.

Additionally, while the "lazy" and "eager" policies for accessing replicated data are described in the context of PRAM and other resistive memory designs, the methods described herein are broadly applicable to increasing memory access performance for virtually any type of computer system employing any type of memory hardware or architecture. For example, the "lazy" and "eager" replication policies are also applicable for use with static random access memory (SRAM), DRAM, and other types of memory technologies. For example, the "eager" policy may provide better performance than a baseline, unreplicated system when failures are rare, and minimizes performance overhead at the end of the device lifetime when failures are more common. Therefore, dynamically replicated memory methods and associated access policies have a wide area of application.

Illustrative Computing Environment

Figure 4:
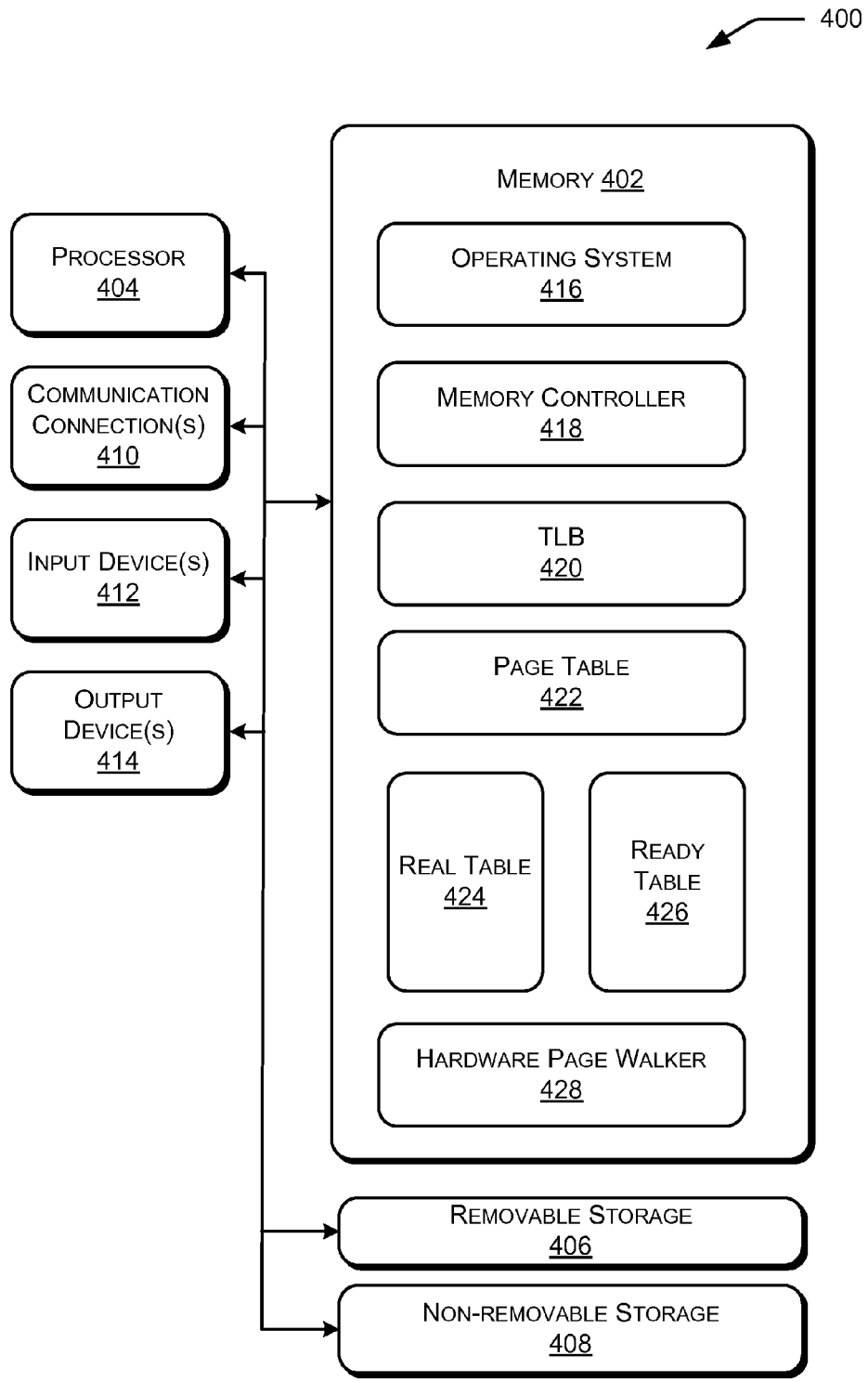
FIG. 4 is a block diagram of a computer environment showing an illustrative system in which a dynamically replicated memory system can be implemented.

FIG. 4 provides an illustrative overview of one computing environment 400 in which aspects of the disclosure may be implemented. The computing environment 400 may be configured as any suitable computing device capable of implementing a dynamically replicated memory system. By way of example and not limitation, suitable computing devices may include personal computers (PCs), servers, server farms, datacenters, or any other device using memory technologies that are susceptible to failure of memory blocks.

In one illustrative configuration, the computing environment 400 comprises at least a memory 402 and one processing unit 404. The processing unit 404 may be implemented as appropriate in hardware, software, firmware, or combinations thereof. Software or firmware implementations of the processing unit 404 may include computer- or machine-executable instructions written in any suitable programming language to perform the various functions described.

Memory 402 may store program instructions that are loadable and executable on the processor 404, as well as data generated during the execution of these programs. Depending on the configuration and type of computing device, memory 402 may be volatile (such as RAM) and/or non-volatile (such as ROM, flash memory, etc.). The computing device or server may also include additional removable storage 406 and/or non-removable storage 408 including, but not limited to, magnetic storage, optical disks, and/or tape storage. The disk drives and their associated computer-readable media may provide non-volatile storage of computer readable instructions, data structures, program modules, and other data for the computing devices. In some implementations, the memory 402 may include multiple different types of memory, such as PRAM and at least one other type of memory, such as SRAM, DRAM, or ROM.

Memory 402, removable storage 406, and non-removable storage 408 are all examples of computer readable storage media. For example, computer-readable storage media may include volatile and non-volatile, removable and non-removable media implemented in any method or technology for storage of information such as computer-readable instructions, data structures, program modules or other data. Memory 402, removable storage 406, and non-removable storage 408 are all examples of computer storage media. Additional types of computer storage media that may be present include, but are not limited to, PRAM, SRAM, DRAM, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can accessed by the server or other computing device. Combinations of the any of the above should also be included within the scope of computer-readable media.

The computing environment 400 may also contain communications connection(s) 410 that allow the computing environment 400 to communicate with a stored database, another computing device or server, user terminals, and/or other devices on a network.

The computing environment 400 may also include input device(s) 412 such as a keyboard, mouse, pen, voice input device, touch input device, etc., and output device(s) 414, such as a display, speakers, printer, etc.

Turning to the contents of the memory 402 in more detail, the memory 402 may include an operating system 416 and one or more application programs or services for implementing the dynamic memory replication system 100. In one implementation, the memory 402 includes a memory controller module 418. The memory controller module 418 may be configured to manage the flow of data going to and from the main memory. In one aspect, the memory controller module 418 is located in the memory 402 as shown in FIG. 2. Alternatively, however, the memory controller module 418 may be located onboard the processor 404. As discussed in further detail, memory controller module 418 may also be configured to detect faulty memory, tracking replicated memory addresses, and accessing replicated memory.

The memory 402 further includes a translation lookaside buffer (TLB) module 420, a page table module 422, a real table module 424, a ready table module 426, and a hardware page walker module 428. The TLB module 420 may be configured to store virtual-to-physical address translations and, as will be discussed in further detail, physical-to-real address translations. In one aspect, the TLB module 420 is configured to extend a standard TLB by at least one and half its original width. The page table module 422 may be configured to store virtual-to-physical address mappings. The real table module 424 may be configured to store physical-to-real address mappings. In one aspect, the real table is stored in a global location of the memory 402. The ready table module 426 may be configured to store a list of memory pages, both pristine memory pages and compatible pairs of faulty memory pages, the memory pages are available for use by the memory controller 418. In one aspect, the ready table module 426 is stored in a region of memory 402 that is not made up of PRAM. In another aspect, the ready table module 426 can be maintained by hardware, and in yet another aspect, the ready table module 426 can be maintained by software. The hardware page walker module 428 is configured to read the contents of multiple memory locations and use the data to compute physical and real addresses.

Detecting and Reliably Recording Memory Faults

Figure 5:
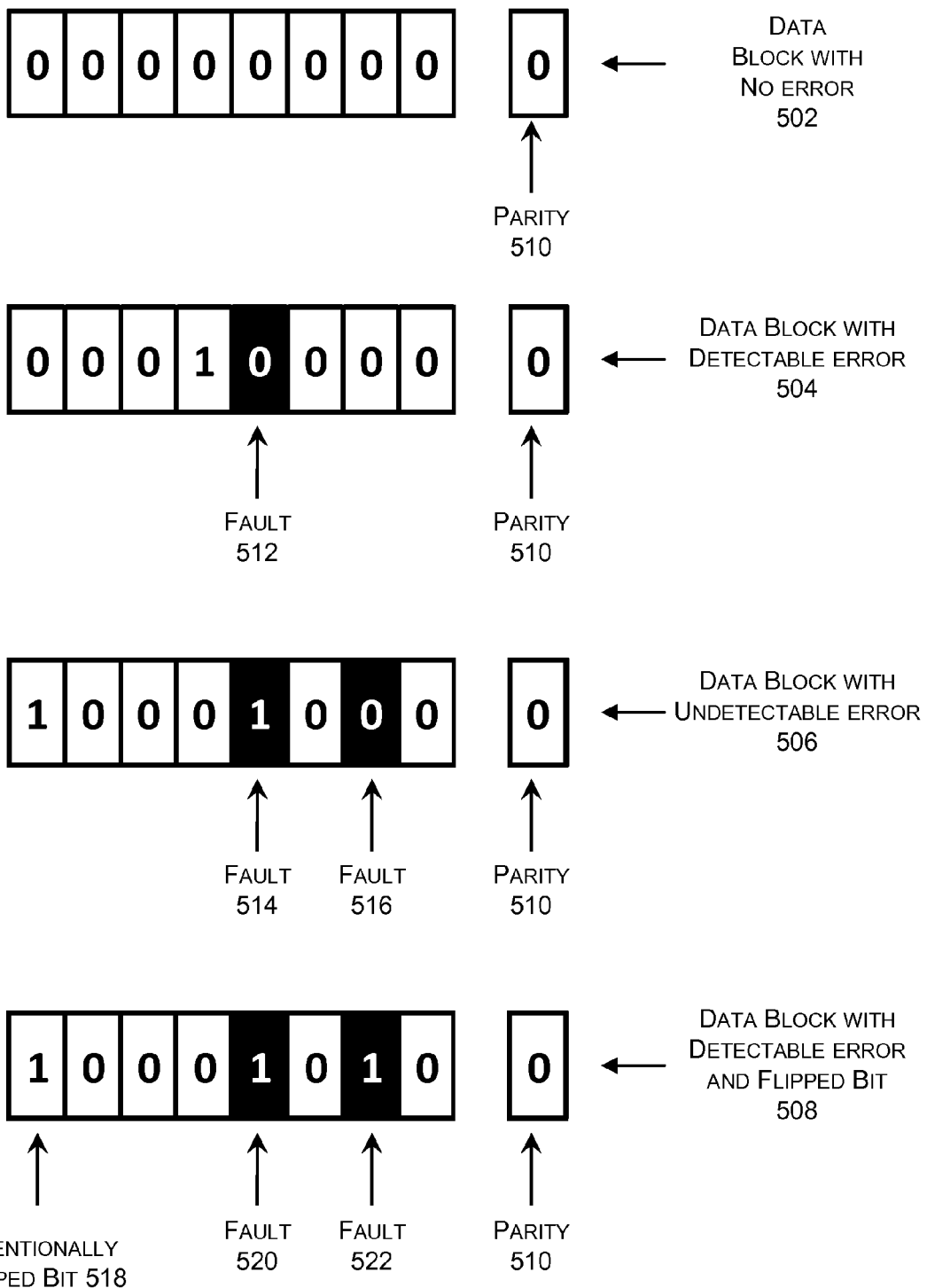
FIG. 5 is a schematic diagram of an illustrative error checking and reliable recording method using a parity bit and intentional bit flipping.

FIG. 5 depicts a schematic diagram illustrating a data block with no error 502, a data block with detectable error 504, a data block with undetectable error 506, a data block with detectable error and flipped bit 508, as well as parity bit 510 that is used to help detect and record the memory faults. By way of example, and not limitation, each data block contains eight bits plus one parity bit 510. However, virtually any sized data block may be used. The parity bit may reside anywhere in the data block. However, in the illustrated example, the parity bit resides at the end of the data block. The parity bit 510 is set by the memory controller 418 such that the total number of "1"s in the codeword including the parity bit (parity plus data) is even at each point in time.

Assume that the memory controller attempted to write a data block of all zeros (which has a zero parity bit) to a memory location. The data block with no error 502 shows the result when no bit errors occur. This maintains the even parity and signals to the memory controller 418 that this block is error free. In another aspect, an error may occur when writing this data block. For example, data block with detectable error 504 contains one fault 512. Since the parity bit is zero, there are an odd number of "1"s in this codeword, so on future reads, the memory controller will know that this location is faulty. In yet another aspect, two errors may occur during a write, resulting in data block with undetectable error 506, which contains two faults, fault 514 and fault 516. Due to the even number of faults, the parity bit appears correct, which means it fails to indicate that this data block is faulty. To make this error detectable, memory controller 418 will set intentionally flipped bit 518 to "1". Intentionally flipped bit 518 can be any non-faulty bit in the block, including the parity bit. The result of this change is data block 508. When data block 508 is read in the future, the parity bit will not correspond to the number of ones in the data, so the memory controller will know that the block is faulty. In another example, using a hardware implementation, the memory controller 418 could change the parity bit 510 to signal an error, unless the error were in the parity bit 510 itself.

Figure 6:
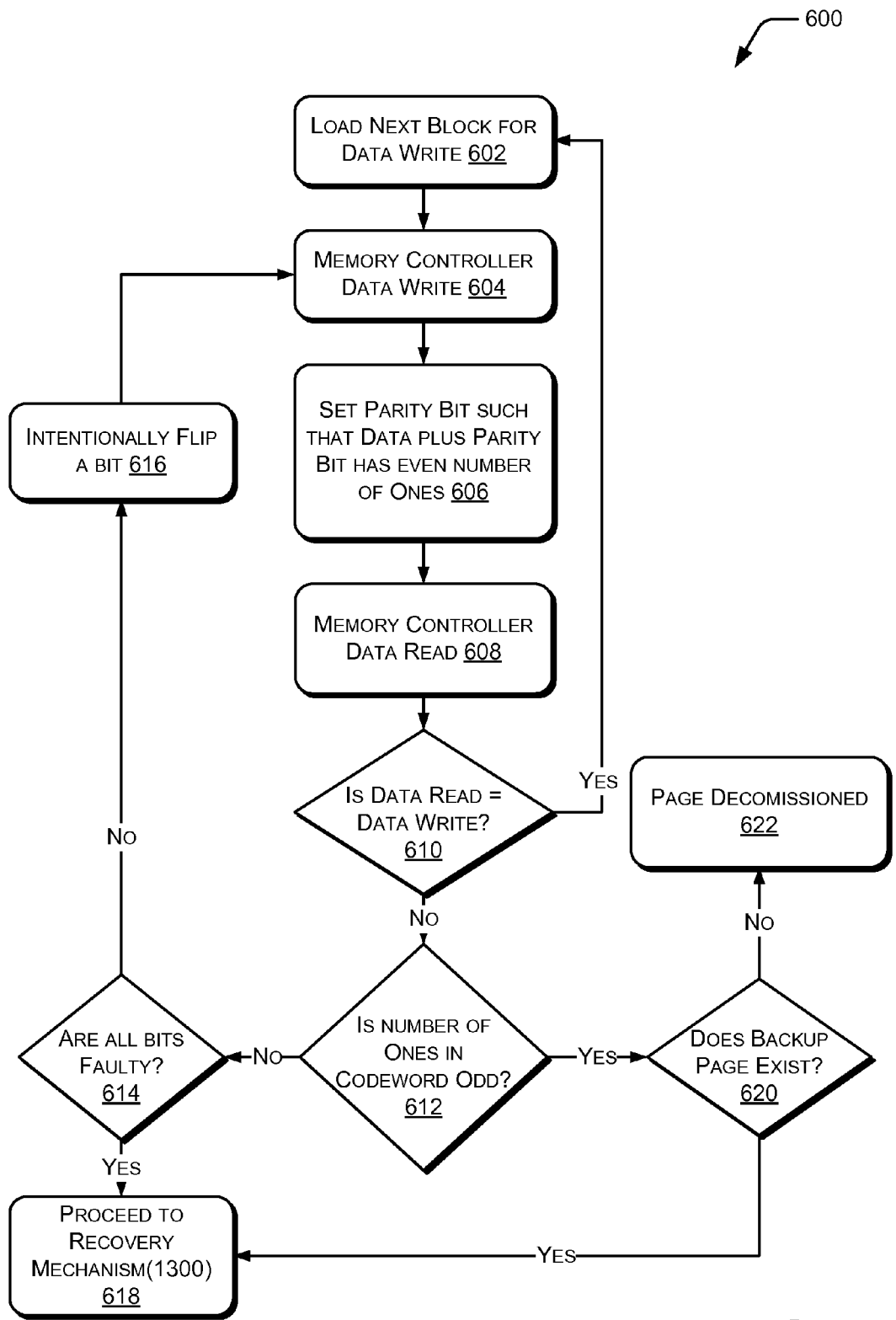
FIG. 6 is a flowchart illustrating details of an error checking and reliable recording method.

FIG. 6 is a flowchart of one illustrative method 600 for detecting and reliably recording memory faults. The method 600 may, but need not necessarily, be implemented using the dynamic memory replication system 100 shown in FIG. 1. In this particular implementation, the method 600 begins at optional block 602 in which the memory controller 418 loads the next block of data to be written to memory. At block 604, the memory controller 418 writes the loaded data to a location in memory. At block 606, the memory controller 418 counts the number of "1"s in the block of data and sets the parity bit 510 such that the codeword (parity plus data) contains an even number of "1"s. At block 608, the memory controller 418 re-reads the data that was just written to the memory location (the checker-read) to compare the read data to the written data. This approach is not overly inefficient in terms of performance because writes are much more expensive (in terms of both latency and energy) compared to reads in PRAM. Hence, by issuing the checker-read of method 600 after each array write to PRAM, the read latency is largely amortized over the write latency, with only a small impact on overall system performance.

As indicated at decision block 610, the method 600 determines whether the data read from the memory location above are consistent with the data written to the same memory location. If so, the method 600 terminates by returning to optional block 602. If the read data do not equal the written data, the method 600 determines at decision block 612 whether the number of "1"s in the codeword (parity plus data) is even. If not, the method 600 determines at decision block 614 if all bits in the memory block are faulty. If not, at block 616, the memory controller 418 intentionally flips a bit. The bit that is flipped should be at a non-faulty position in the memory block. Then, at block 604 the data are rewritten to the same memory block. This way, the checker-read can once again determine if the error was detected. If, however, the method 600 determines at decision block 620 that all the bits in the memory block are faulty, the method 600 terminates at block 618 by signaling the operating system 416 to proceed to the recovery mechanism 1300 of FIG. 13.

Referring back to decision block 612, if the number of "1"s in the codeword (parity plus data) is odd, then we have successfully marked the block as a faulty block. Then, method 600 determines at decision block 620 whether a backup page exists for the purpose of recovery. If so, the method 600 terminates at block 618 by signaling the operating system 416 to proceed to the recovery mechanism 1300 of FIG. 13. On the other hand, if no backup page exists, the method 600 terminates at block 622 by decommissioning the memory page so that it is never used again.

Dynamically Replicating Memory

Figure 7:
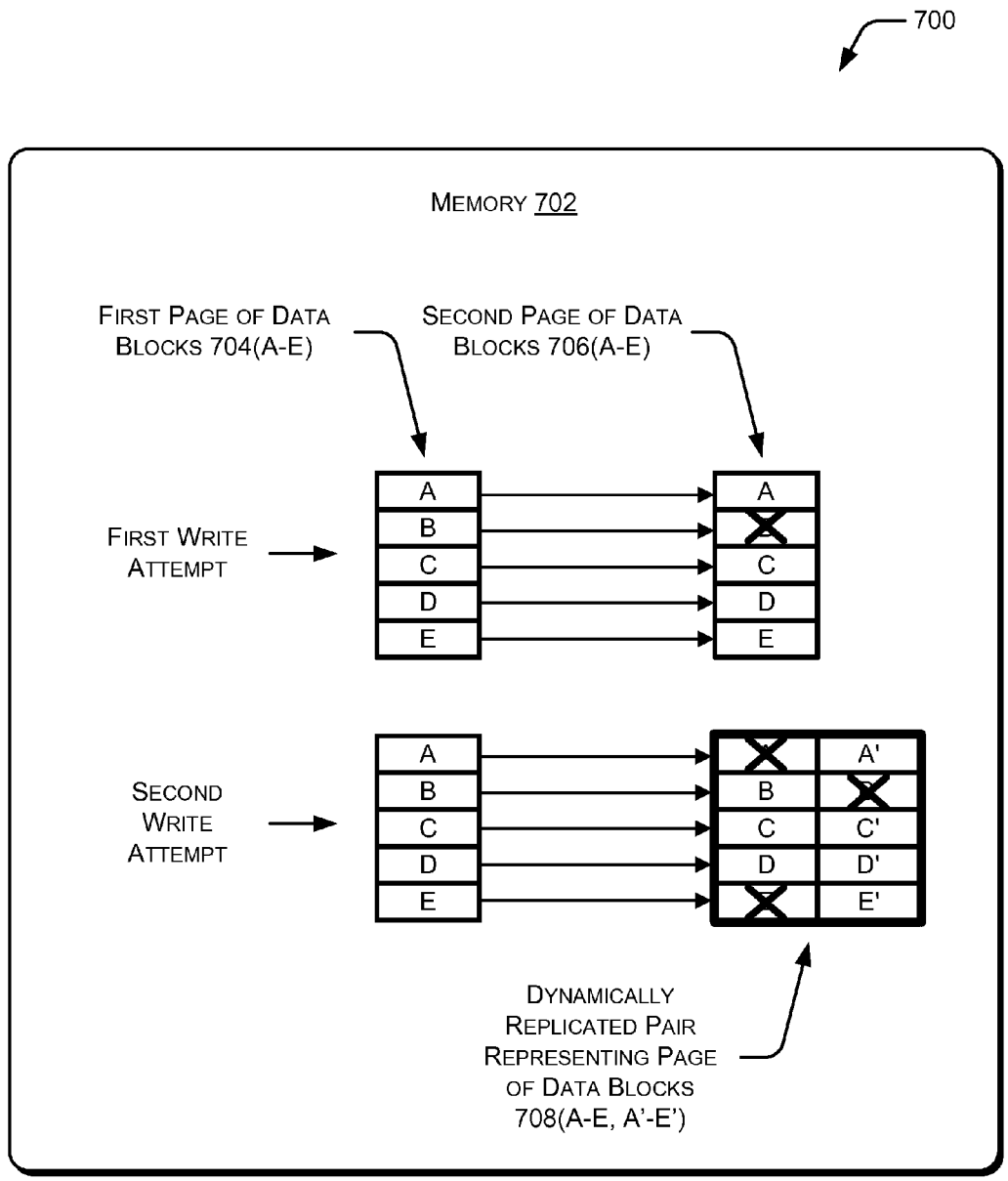
FIG. 7 is a schematic diagram of an illustrative method of dynamically replicating memory pages that contain faults.

FIG. 7 provides a schematic diagram illustrating a dynamically replicated memory method 700 in an illustrative memory module 702. In this example, memory 702 contains at least one first page 704, containing at least data blocks A-E, a second page 706 containing at least data blocks A-E, and a dynamically replicated pair of faulty memory pages representing one non-faulty memory page 708, containing at least data blocks A-E and A'-E'. In one aspect, the memory controller 418 may attempt to write the data of first page 704 to second page 708 prior to determining that second page 706 has a faulty block at location B. To store the data intended for second page 706 without data loss, the pair of pages 708 is dynamically replicated to represent the second page 706, and the data is written to dynamically replicated pair of faulty memory pages representing one non-faulty memory page 708. Data blocks 708(A'-E') represent the backup data blocks (or replicas) of data blocks 708(A-E). In other words, data page 708(A'-E') is a replica of data page 708(A-E).

First page of data blocks 704(A-E) may be written to second page of data blocks 706(A-E) as part of any regular data manipulation functionality of illustrative computer system 102 such as, for example, data written to a cache, data written to PRAM, SRAM, DRAM, main memory, or data written to removable storage 406 or non-removable storage 408.

In one aspect, second page of data blocks 706(A-E) is error free (not shown). In that case, first page of data blocks 704(A-E) is written to second page of data blocks 706(A-E) without requiring a dynamically replicated pair of pages representing a page of data blocks 708(A-E, A'-E'). However, in another aspect, second page of data blocks 706(A-E) has at least one faulty data block. In the example of FIG. 7, the faulty data block is represented as data block 706(B). In other examples, the second page of data blocks 706(A-E) could contain faulty data blocks at any combination of locations, or at all data block locations.

In the illustrated implementation, each block of data (A-E) of first page of data blocks 704(A-E) is written to each block of data (A-E) of second page of data blocks 706(A-E). For example, any combination of data blocks (A-E) could be written from first page of data blocks 704(A-E) to second page of data blocks 706(A-E). In FIG. 7, because all data blocks A-E are written to second page of data blocks 706(A-E), and at least one data block is faulty, the dynamically replicated memory method 700 will signal the memory fault recovery method 1300, discussed in further detail below. As part of the memory fault recovery method 1300, the data of first page of data blocks 704(A-E) that was written to second page of data blocks 706(A-E) will then be written to dynamically replicated pair of pages representing a page of data blocks 708(A-E, A'-E'). In this way, the two previously unusable faulty memory pages can be reused to store the data from first page of data blocks 704(A-E) without causing a software failure or hang. More specifically, each data block A-E from first page of data blocks 704(A-E) will be written to both pages in the dynamically replicated pair representing a page of data blocks 708(A-E) and 708(A'-E'). As discussed above, because both pages in the pair 708(A-E) and 708(A'-E') are compatible, each data block is represented without fault at least once, and none of the data from first page of data blocks 704(A-E) is lost.

In one aspect, dynamically replicated pair 708 may be made up of any number of compatible faulty memory pages. For example, dynamically replicated pair 708 may be comprised of three compatible faulty memory pages, where each memory block location may be represented by at least one of the three faulty memory pages. In this way, three, or more, otherwise unusable memory pages can be combined to dynamically replicate one pristine memory page.

In yet another aspect, memory controller 418 may only attempt to write data block 704(B) to data block 706(B). If, however, it was discovered that data block 706(B) was faulty, and thus second page of data blocks 706(A-E) was faulty, the memory controller 418 may copy the entire contents of page 706 to replicated pair 708. Upon replicating memory to recover from the faulty page of data 706, data block 704(B) could then successfully be written to 708(B) and 708(B').

Figure 8:
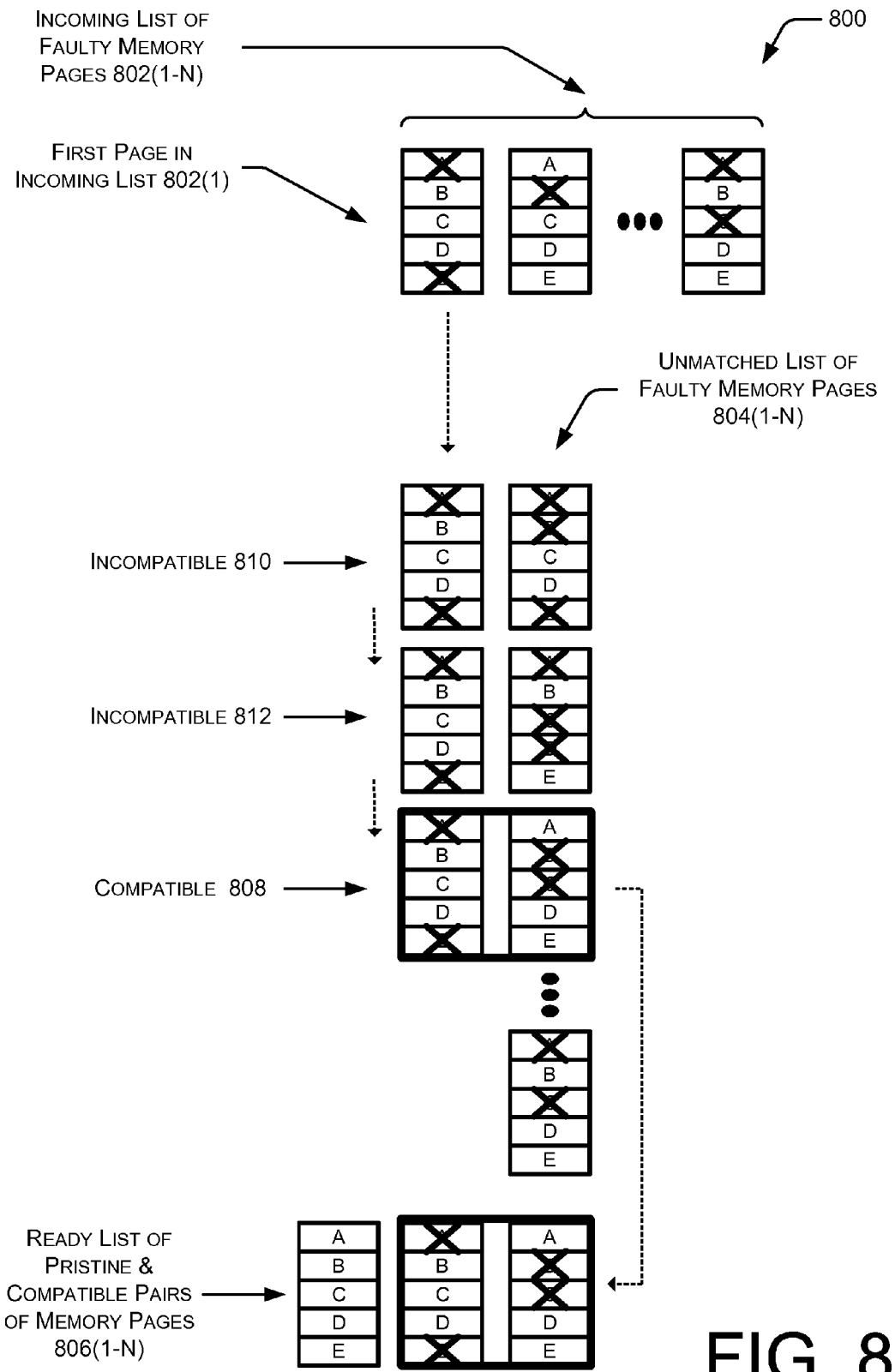
FIG. 8 is a schematic diagram of an illustrative method of dynamically replicating memory pages that contain faults using an incoming list, an unmatched list, and a ready list.

FIG. 8 provides a schematic diagram illustrating a dynamic pairing algorithm 800 stored in memory module 104 (not shown) and executed on illustrative processor 404. Memory 104 contains an incoming list of faulty memory pages 802(1-N), an unmatched list of faulty memory pages 804(1-N), and a ready list of pristine and compatible pairs of memory pages 806(1-N). Incoming list of faulty memory pages 802(1-N) contains faulty memory pages that have either been recently detected as faulty or recently detected as incompatible with its pair. Memory pages in the incoming list of faulty memory pages 802(1-N) have not been compared with other faulty pages since the last immediate failure detection or incompatibility detection of the page.

The unmatched list of faulty memory pages 804(1-N) contains faulty memory pages that may have already been compared to each and every other faulty memory page in the unmatched list of faulty memory pages 804(1-N). Faulty memory pages that are incompatible with all other faulty memory pages in the unmatched list of faulty memory pages 804(1-N) remain in the unmatched list of faulty memory pages 804(1-N) until a new match is found. In this example a new match will be found when a new faulty page from the incoming list of faulty memory pages 802(1-N) is determined to be a compatible match with a faulty memory page already in the unmatched list of faulty memory pages 804(1-N).

The ready list of pristine and compatible pairs of memory pages 806(1-N) contains both pristine memory pages (pages with no faults) and compatible pairs of faulty memory pages (dynamically replicated memory), such as compatible pair 808. The pages and compatible pairs, like compatible pair 808 in ready list 806(1-N), are ready for consumption by the dynamically replicated memory method 700.

To fill the ready list 806(1-N), the dynamic pairing algorithm 800 takes the first page in the incoming list 802(1) and compares it to each faulty page in the unmatched list 804(1-N). For example, and not by way of limitation, FIG. 8 shows the comparing process beginning with incompatible pair 810. As discussed above, the faulty pages of incompatible pair 810 are incompatible because not every memory block can be represented without error by the pair. More specifically, memory blocks A and E are faulty in both pages of incompatible pair 810; therefore, they are incompatible. Dynamic pairing algorithm 800 then leaves the unmatched page that already existed in the unmatched list 804(1-N) in its current position in the unmatched list 804(1-N) and continues to compare the first page of the incoming list 802(1) with the next page in the unmatched list 804(1-N). FIG. 8 also shows incompatible pair 812 as another example of two faulty pages that do not match. The faulty pages of incompatible pair 810 are incompatible because the memory block at location A is faulty in both pages. Again, dynamic pairing algorithm 800 leaves the unmatched page that already existed in the unmatched list 804(1-N) and continues to compare the first page of the incoming list 802(1) with the next page in the unmatched list 804(1-N) until a match is found. Compatible pair 808 is an example of a match. In this example, the two faulty pages of compatible pair 808 do not share any data block locations with errors. More specifically, each data block (A-E) can be represented by at least one page in the pair. Dynamic pairing algorithm 800 then places compatible pair 808 in the ready list 806(1-N) for consumption by the dynamically replicated memory method 700 and starts the process over with the next page in the incoming list 802(2) (not shown).

If, however, the first page in the incoming list 802(1), or any page thereafter 802(2-N) (not shown) is not compatible with any pages in the unmatched list 804(1-N), the incompatible faulty page will be placed in the unmatched list 804(1-N) for later attempts at matching. This process is repeated by the dynamic pairing algorithm 800 until all pages in the incoming list 802(1-N) are either paired up with a compatible page and placed in the ready list 806(1-N) or determined to be incompatible with all faulty pages in the unmatched list 804(1-N) and placed in the unmatched list 804(1-N). Pages with too many faults may be discarded and removed from the unmatched list to improve page pairing performance.

In one aspect, the dynamic pairing algorithm 800 will be executed by the operating system 416 based on an interrupt called by the memory controller 418. This interrupt may cause the operating system 416 to signal a high-priority kernel thread whose sole job is to refill the ready list 806(1-N). In another aspect, the addresses of the pages in the ready list 806(1-N) are stored in the ready table 426. In yet another aspect, the dynamic pairing algorithm 800 is implemented by the memory controller. In yet another aspect, the incoming list 802(1-N) and the unmatched list 804(1-N) are maintained by the operating system 416 as two linked lists of real pages.

In one aspect, multiple faulty memory pages are combined to replicate one pristine memory page. For example, the ready list 806, may contain, pristine memory pages, compatible pairs of memory pages, and compatible combinations of any number of memory pages. In this way, two or more incompatible memory pages may become compatible by the addition of a third, or more, memory pages that complete the compatibility. As described above, as long as each memory block location may be represented by at least one of the faulty memory pages in the compatible combination, data loss can be avoided by use of the replicated memory page.

Additionally, as one example, the dynamic pairing algorithm 800 may order the combined memory pages in such a way that memory pages with fewer errors are placed closer to the front of the list of the compatible combination. In other words, the dynamic pairing algorithm 800 may be configured to associate memory pages with fewer errors as the primary memory page in the replicated group, or pair, and to associate memory pages with more errors as the backup pages, or page, in the replicated group, or pair. This configuration may potentially decrease the number of backup page accesses during data reads and writes. As another example, the dynamic pairing algorithm 800 may be configured to take into account the number of faults in each page in order to determine the best-possible pairs.

Figure 9:
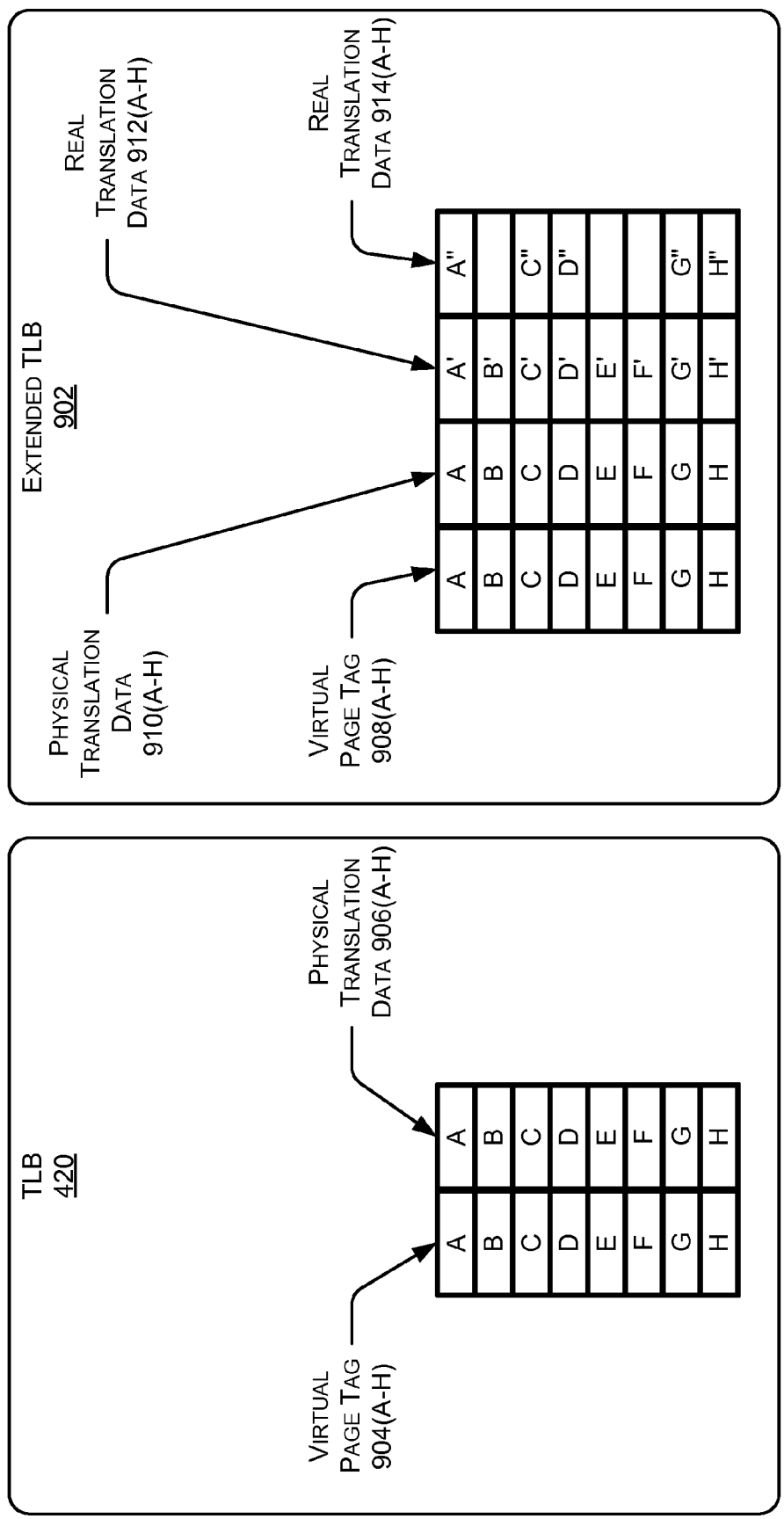
FIG. 9 is a schematic diagram of an illustrative translation lookaside buffer (TLB) and an illustrative extended TLB usable for storing physical and real translation data of virtual page tags.

FIG. 9 provides a schematic diagram of a standard translation lookaside buffer (TLB) 420, and an extended TLB 902 stored in memory 402 (not shown). A standard TLB contains two columns, the first for storing virtual page tags 904(A-H), and the second for storing physical translation data 906(A-H). Each row (A-H) in each column, contains the associated virtual page tags 904(A-H) and physical translation data 906(A-H) for each page in memory 402. More specifically, for memory page A, virtual page tag 904(A) stores the metadata associated with the virtual page of memory page A and translation to a physical address 906(A). In order to accommodate real addresses, along with the virtual page tag column 908(A-H) and physical translation data column 910(A-H), extended TLB 902 should also contain two additional columns for real translation data 912(A-H) and 914(A-H). Real translation data columns 912(A-H) and 914(A-H) store the translation from the physical addresses to the real address. More specifically, in reference to memory page A again, real translation data columns 912(A-H) and 914(A-H) store the physical-to-real address mapping for memory page A, signified by A' and A". In one aspect, some memory pages are not replicated, for example memory page B in extended TLB 902 has not been replicated. In this situation, there will be only one real address in the table signified by B', the second entry will be empty.

Figure 10:
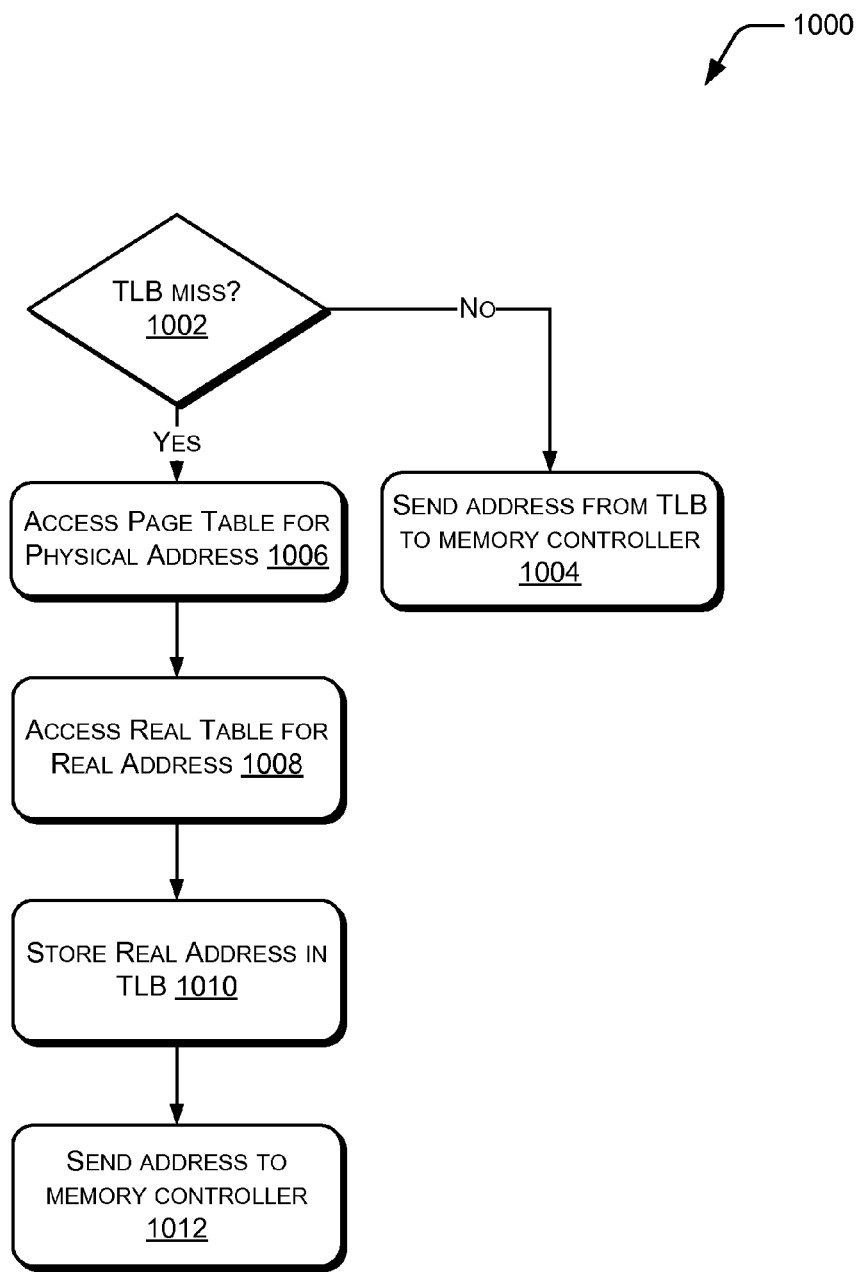
FIG. 10 is a flowchart illustrating details for use of an extended TLB.

FIG. 10 is a flowchart of one illustrative method 1000 for tracking the real addresses of memory pages. The method 1000 may, but need not necessarily, be implemented using the dynamic memory replication system 100 shown in FIG. 1. In this particular implementation, the method 1000 begins at optional decision block 1002 in which the memory controller 418 determines if a TLB 420, or extended TLB 902, miss has occurred for a memory page that is requested. If not, the method 1000 terminates at block 1004 where the address stored in the TLB 420, or extended TLB 902, is sent to the memory controller 418. On the other hand, if a TLB 420, or extended TLB 902, miss has occurred at decision block 1002, at block 1006 a hardware page walker 428 accesses the page table 422 to receive the virtual-to-physical address mapping of the memory page. The hardware page walker 428 then accesses the real table 424 to receive the physical-to-real address mapping of the memory at block 1008, stores the real address in the TLB 420, or extended TLB 902 at block 1010, and then terminates at block 1012 where the address is sent to the memory controller 418 for further processing.

Figure 11:
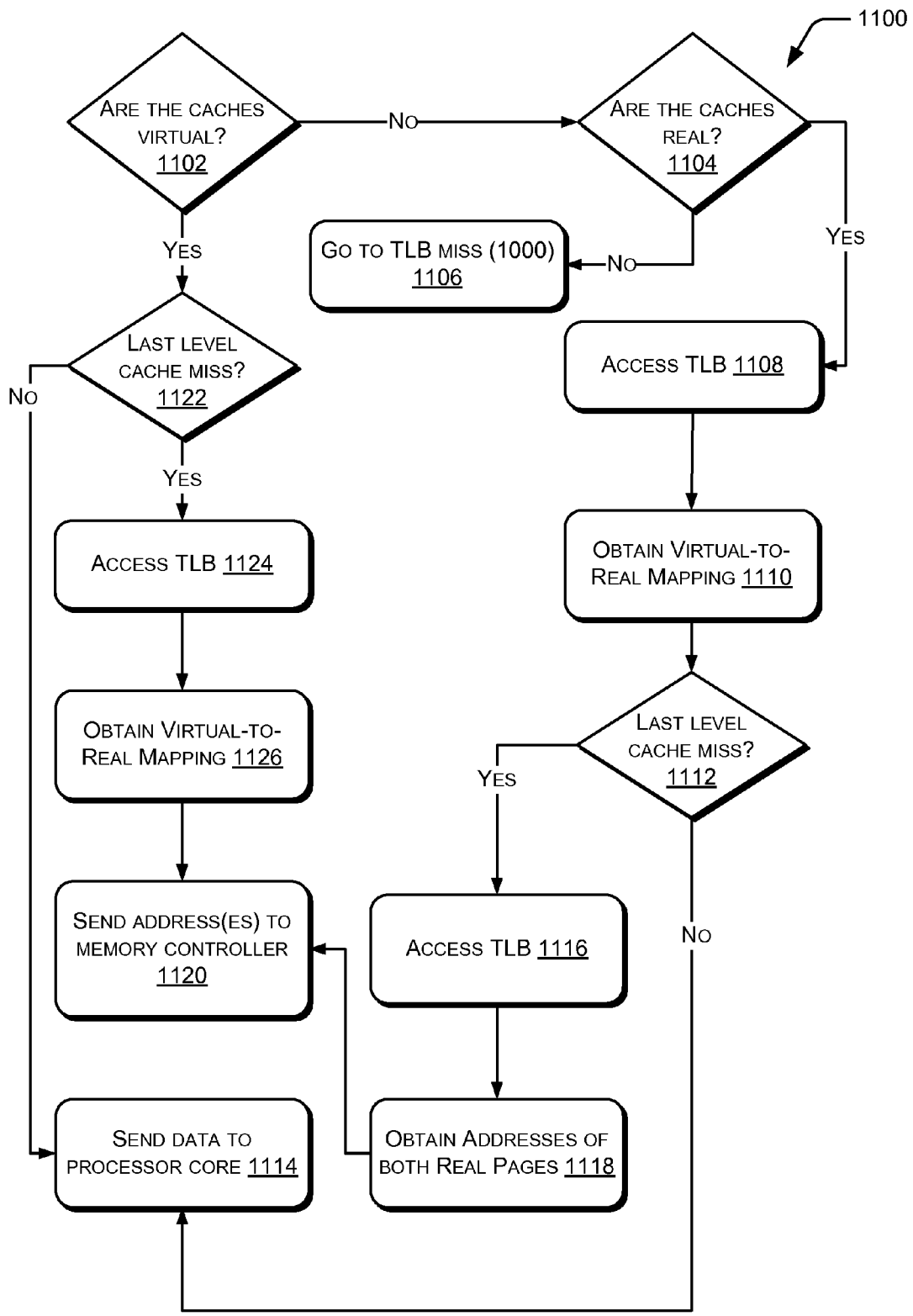
FIG. 11 is a flowchart illustrating details for use of an extended TLB when caches are either virtually tagged or tagged with real addresses.

FIG. 11 is a flowchart of one illustrative method 1100 of further tracking the real addresses of memory pages when the caches of computer system 102 are either virtually indexed and virtually tagged, or virtually indexed and tagged with real addresses. The method 1100 may, but need not necessarily, be implemented using the dynamic memory replication system 100 shown in FIG. 1. In this particular implementation, the method 1100 begins at optional decision block 1102 in which it is determined whether the caches are virtual. If not, the method 1100 determines at decision block 1104 whether the caches are real. If not, the method 1100 terminates at block 1106 by signaling that a TLB 420, or extended TLB 902, miss has occurred and executing method 1000 of FIG. 10. Otherwise, if the caches are real, referring back to decision block 1104, the hardware page walker 428 accesses the TLB 420, or the extended TLB 902 at block 1108 and obtains the virtual-to-real address mapping at block 1110. At decision block 1112, the memory controller 418 determines whether a last level cache miss has occurred. If not, the method 1100 terminates at block 1114 by sending the appropriate data to the processor core 404. On the other hand, back to decision block 1112, if a last level cache miss occurred, the hardware page walker 428 accesses the TLB 420, or the extended TLB 902, at block 1116, obtains the addresses of both real pages associated with the requested memory page at block 1118, and terminates at block 1120 by sending the address, or addresses, to the memory controller 418.

Referring back to decision block 1102 of FIG. 11, if the caches are virtual, meaning they are virtually indexed and virtually tagged, the method 1100 determines at decision block 1122 whether a last level cache miss occurred. If not, the method terminates at block 1114 by sending the appropriate data to the processor core 404. On the other hand, if a last level cache miss has occurred, the hardware page walker 428 will access the TLB 420, or the extended TLB 902, at block 1124, obtain the virtual-to-real address mapping for the requested memory page at block 1126, and terminate at block 1120 by sending the address, or addresses, to the memory controller 418.

Recovering from Memory Faults

Figure 12:
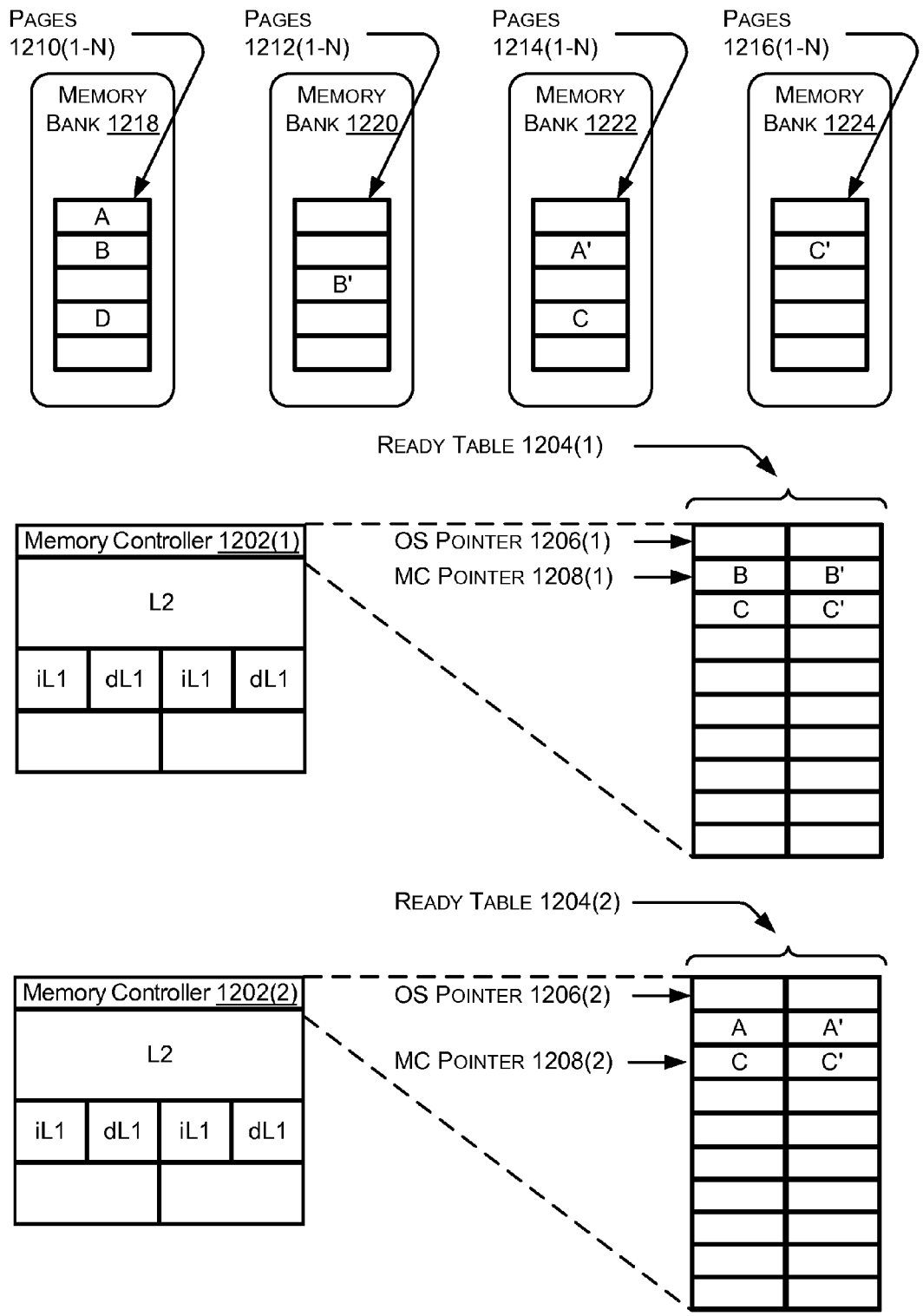
FIG. 12 is a schematic diagram of an illustrative method of recovering from memory faults.

FIG. 12 provides a schematic diagram of a memory controller 1202 and a ready table 1204, both before and after the executing of the memory fault recovery method 1300 of FIG. 13, to be discussed in further detail below. Illustrative memory controller 1202(1), prior to the execution of the recovery method 1300, and illustrative memory controller 1202(2), after the execution of the recovery method 1300, reside in memory 104 (not shown) along with both level 2 and level 1 caches which are well known by those skilled in the art and others. Additionally, ready tables 1204(1) and 1204(2), which represent ready table 1204 before and after the execution of recovery method 1300 respectively, contain an operating system pointer (OS Pointer) 1206 and a memory controller pointer (MC Pointer) 1208. Similarly, OS Pointers 1206(1) and 1206(2) as well as MC Pointers 1208(1) and 1208(2) represent the respective pointers 1206 and 1208 before and after the execution of recovery method 1300.

FIG. 12 also provides schematic diagrams of memory pages 1210(1-N), 1212(1-N), 1214(1-N), and 1216(1-N). As seen in FIG. 12, each set of memory pages resides on a different memory bank, respectively, memory banks 1218, 1220, 1222, and 1224. For example only, and not by way of limitation, memory pages 1210(1-N) are made up of primary memory page A, primary memory page B, and primary memory D, memory pages 1212(1-N) are made up of backup page B', memory pages 1214(1-N) are made up of backup page A' and primary page C, and memory pages 1216(1-N) are made up of backup page C'. The significance here is that each backup page, namely A', B', and C', resides on a different memory bank than its respective primary page.

By way of example, and not limitation, the ready table 1204 functions as a circular buffer that allows the memory controller 418 and the operating system 416 to exchange memory pages and/or memory page identifiers. As described above, the operating system 416 places compatible pairs or pristine pages in to the ready table 1204, and the memory controller 418 consumes these pages and replaces them with incompatible pages to be re-paired. The ready table 1204 uses the OS Pointer 1206 and the MC Pointer 1208 to indicate which part of the ready table 1204 is which. Entries from the MC Pointer 1208 up to the OS Pointer 1206 (exclusive) are ready for the memory controller 418 to use, and entries from the OS Pointer 1206 to the MC Pointer 1208 (exclusive) are dead pages for the operating system 416 to handle. If both OS Pointer 1206 and MC Pointer 1208 point to the same location, then all pairs are ready for the memory controller 418.

Ready table 1204 is made up of two columns in order to accommodate the possibility of a pair of memory pages. Ready table 1204 contains a list of real pages (or real page pairs) available to use when a write failure occurs. In one aspect, the ready table 1204 is a 128-entry SRAM array co-located with the controller's scheduling queue. Each table entry may contain space for two 32-bit values indicating the real addresses for the pages supplied by operating system 416. These values can indicate either a pair of pages or a single pristine page, in which case the second value would be 0xFFFFFFFF. In another aspect, the ready table 1204 is kept in volatile memory, so that it can be reconstructed when the computer system 102 is powered-up.

As show in FIG. 12, ready table 1204(1), prior to execution of the fault recovery method 1300, contains two compatible pairs of memory pages ready for consumption by the memory controller 418. The first compatible pair is made up of primary memory page B and backup memory page B', and the second compatible pair is made up of primary memory page C and backup memory page C'. By way of example, if the memory controller 418 attempts to write data to compatible pair A and A', and the write fails for both locations, A and A', the memory controller 418 will detect the fault via the checker-read and then initiate the fault recovery method 1300 by copying the data to a new location in memory. In this case, the new location in memory is located at MC Pointer 1208(1); therefore, the data will be written to primary page B and backup page B'. Additionally, the faulty pages, A and A', will be written into the ready table at location MC Pointer 1208(1) and MC Pointer will be incremented to position MC Pointer 1208(2).

Figure 13:
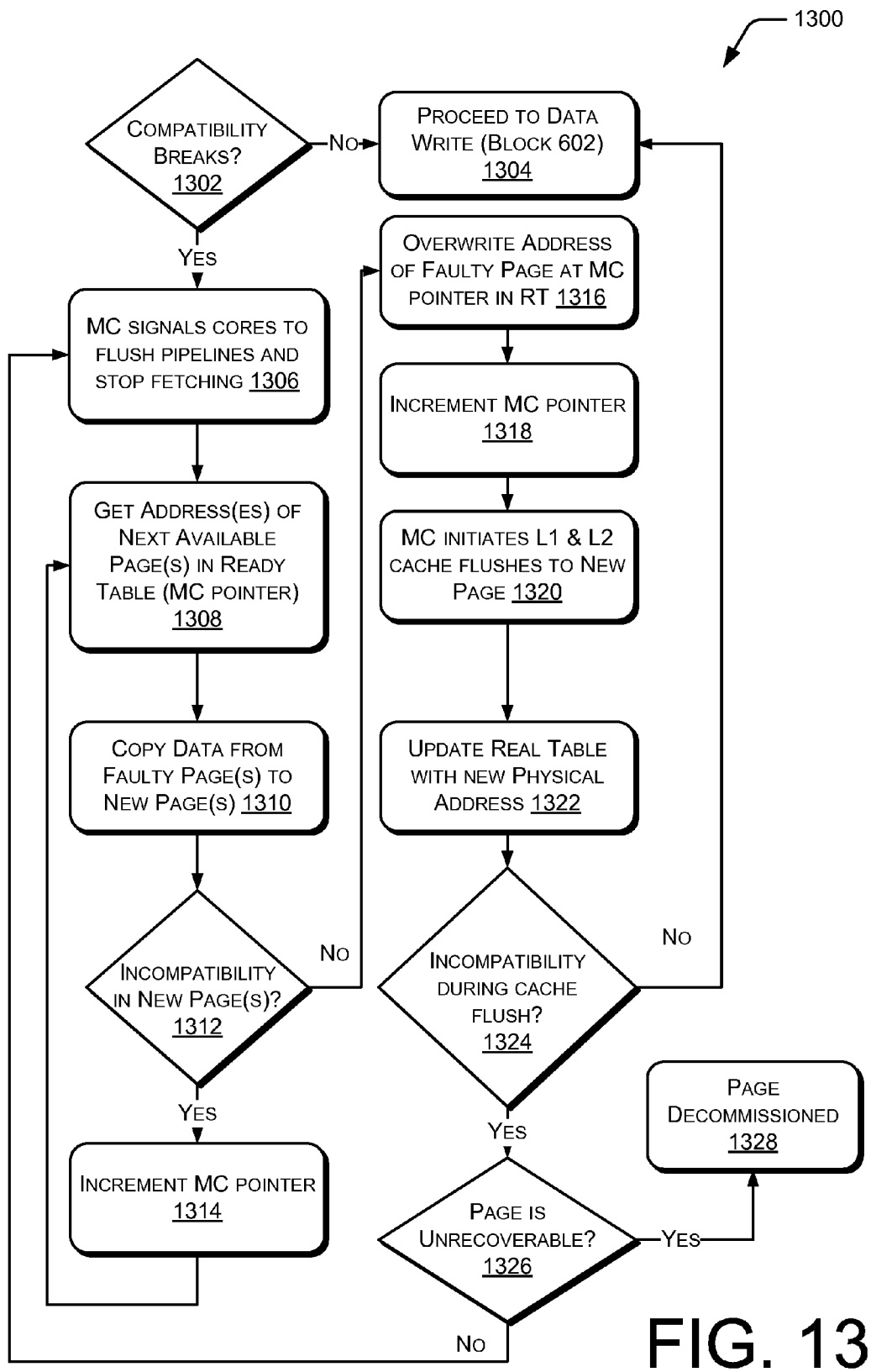
FIG. 13 is a flowchart illustrating details of an illustrative method of recovering from memory faults.

FIG. 13 is a flowchart of one illustrative method 1300 for recovering from memory faults. The method 1300 may, but need not necessarily, be implemented using the dynamic memory replication system 100 shown in FIG. 1. In this particular implementation, the method 1300 begins at optional decision block 1302 in which the memory controller 418 determines whether data cannot be written to a once pristine memory page with a new fault or whether the compatibility between paired memory pages breaks. If not, the method 1300 terminates at block 1304 and the memory controller proceeds to load the next data block for data write, block 602 of error detection method 600. If, however, the compatibility between memory pages breaks, at block 1306 the memory controller 418 will signal the processor cores to flush their pipelines and stop fetching instructions. At block 1308, the memory controller 418 will get either the address of the next available page or the addresses of the next available pages that are located in the ready table 426, located at MC Pointer 1208. At block 1310, memory controller 418 will copy the data from the faulty page, or pages, to the new page, or pages, from the ready table 426. At decision block 1312, the memory controller 418 will determine whether the new page is faulty or whether the new pages are incompatible. If the new page is faulty or the new pages are incompatible, at block 1314 the memory controller 418 will increment MC Pointer 1208 and then get the address(es) of the next available page(s) in the ready table 1204 at block 1308.

However, at decision block 1312, if the memory controller determines that either the new page is not faulty or the new pages from ready table 1204 are compatible, at block 1316, the memory controller 418 will overwrite the addresses of the faulty page(s) in the ready table 1204 at location MC Pointer 1208. At block 1318, the MC Pointer 1208 will be incremented to signify to the operating system 416 that faulty pages or a pair of faulty pages are waiting to be re-paired. At block 1320, the memory controller 418 will initiate both level 1 and level 2 cache flushes to send the data in the cache to the new memory page(s). At block 1322, the real table 424 will be updated with the new physical address of the virtual memory page. At decision block 1324, the memory controller 418 will determine whether the new pair of pages become incompatible during the cache flush. If not, the method 1300 terminates at block 1304 and the memory controller proceeds to the error detection method 600. Otherwise, at decision block 1326, the memory controller 418 determines whether the new page is unrecoverable. If so, the method 1300 terminates at block 1328 by decommissioning the memory page so that it is never used again. Otherwise, if the page is recoverable, the method 1300 returns to block 1306, in order to signal the processor core 404 to once again flush the pipelines, stop fetching instructions, and begin the process over again as if a compatibility break had been detected.

Scheduling Access to Primary and Backup Pages

Figure 14:
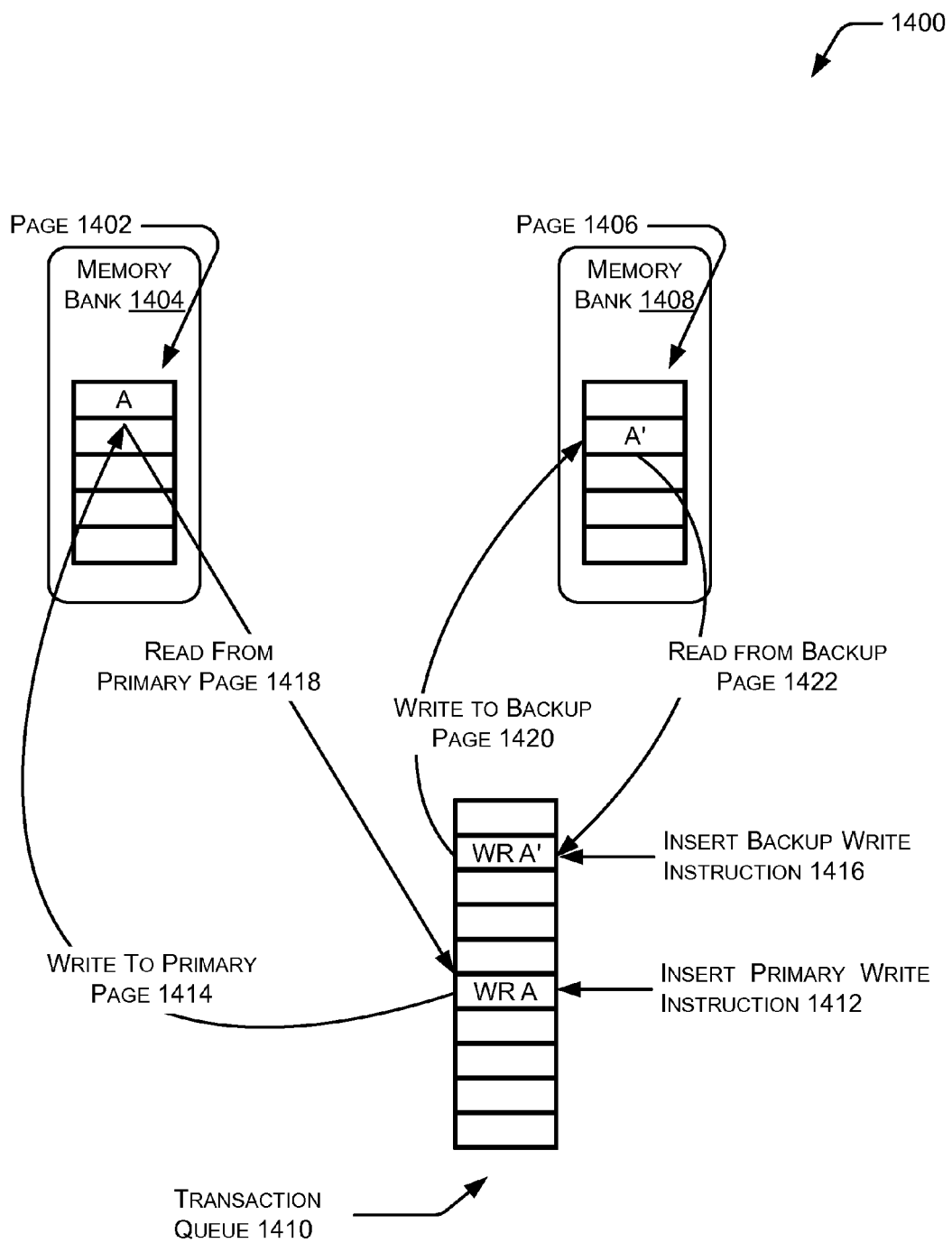
FIG. 14 is a schematic diagram of an illustrative "lazy" replication policy for use with replicated memory systems.

As discussed above accesses to primary and backup pages can be scheduled in at least two different ways: a "lazy" replication policy or an "eager" replication policy. FIG. 14 is a schematic diagram illustrating a "lazy" replication policy 1400 for scheduling access to replicated memory pages. In FIG. 14, the replicated memory page 1402 resides on memory bank 1404 and the replicated memory page 1406 resides on memory bank 1408. The two replicated memory pages 1402 and 1406 are represented by A and A', with A being the primary page in the pair and A' being the backup page in the pair. The "lazy" replication policy 1400 also relies on transaction queue 1410 for scheduling memory reads and writes.

Under the "lazy" replication policy 1400, data reads (and writes) of the primary and backup pages take place sequentially. That is, the memory page accessing is scheduled such that access to the backup page occurs after the access to the primary page in the case where the primary page is faulty. On the other hand, if the access to the primary page is successful, there is no need to access the backup page. For certain memory architectures this may have certain specific performance benefits.

In one aspect, when memory access is required a primary page write instruction 1412 is inserted into the transaction queue 1410 and the memory controller 418 performs a data write to the primary page 1414. The insertion of the backup write instruction 1416 into the transaction queue 1410 is not performed by the memory controller 418 until after the checker-read from the primary page 1418 returns with fault-free data. If the data read from the primary page 1418 is fault-free then the memory controller 418 terminates the "lazy" replication policy and writes the non-faulty data from the primary page to a location in memory. The data can then be consumed by the operating system 416. However, if the data read from the primary page 1418 is faulty, then memory controller 418 inserts the backup write instruction 1416 into the transaction queue and the write to backup page 1420, followed by the checker-read from backup page 1422 is performed.

Figure 15:
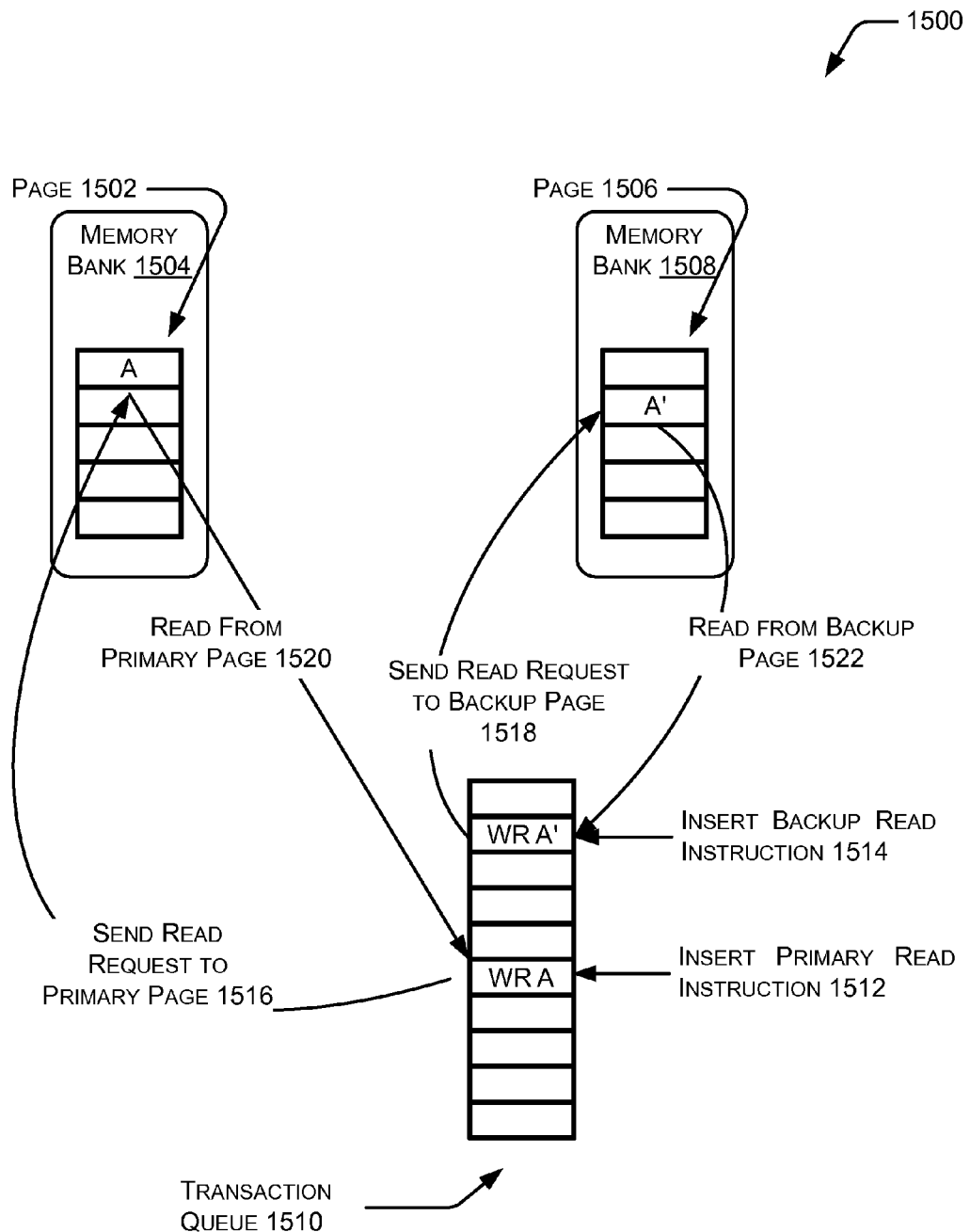
FIG. 15 is a schematic diagram of an illustrative "eager" replication policy for use with replicated memory systems.

FIG. 15 is a schematic diagram illustrating an "eager" replication policy 1500 for scheduling access to replicated memory pages. In FIG. 15, the replicated memory page 1502 resides on memory bank 1504 and the replicated memory page 1506 resides on memory bank 1508. The two replicated memory pages 1502 and 1506 are represented by A and A', with A being the primary page in the pair and A' being the backup page in the pair. The "eager" replication policy 1500 also relies on transaction queue 1510 for scheduling memory reads and writes.

In one aspect, under the "eager" replication policy 1500, data writes to the primary and backup pages take place in parallel. That is, the memory page accessing is scheduled such that requests for access to the primary page and the backup page take place at almost exactly the same time. The fact that memory pages 1502 and 1506 reside on different memory banks 1504 and 1508 makes this possible. For certain memory architectures this may have certain specific performance benefits. In particular, for dynamically replicated memory there is a dramatic impact on overall system performance. Additionally, the "eager" replication policy 1500 offers significant performance enhancements over non-replicated memory systems as well.

In one aspect, under the "eager" replication policy 1500, when memory access is required a primary page read instruction 1512 is inserted into the transaction queue 1510 followed immediately by the backup page read instruction 1514. Here, the memory controller 418 sends the data read request for the primary page 1516 and the data read request for the backup page 1518 in parallel. As soon as the first of either the read from the primary page 1520 or the read from the backup page returns with fault free data, the data can immediately be consumed by the operating system 416 without needing to wait for the other read to return. However, if the data read from the first returned read is faulty, then memory controller 418 will wait for the second read to return with fault free data.

Figure 16:
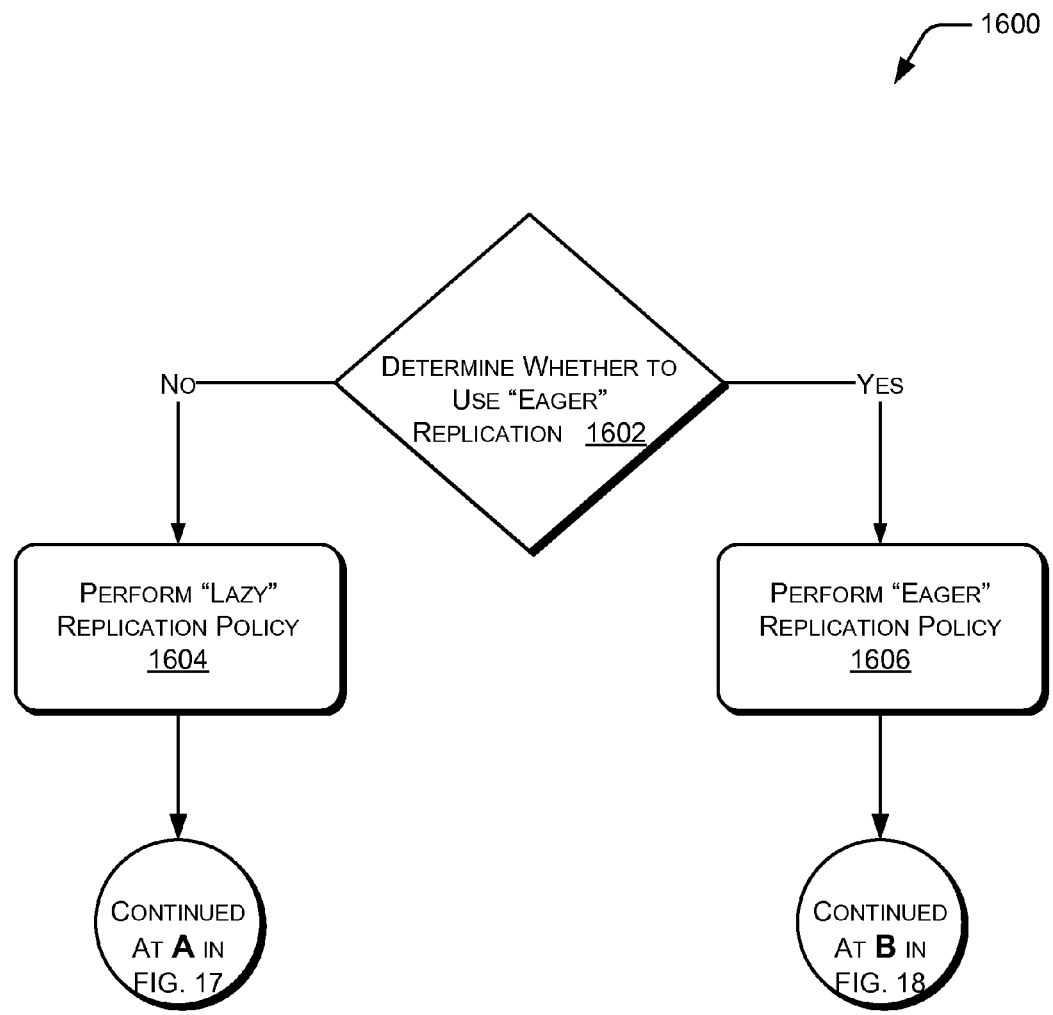
FIG. 16 is a flowchart illustrating details of an illustrative method of determining whether to use a "lazy" replication policy or an "eager" replication policy.

FIG. 16 is a flowchart of one illustrative method 1600 for scheduling access to replicated memory pages. The method 1600 may, but need not necessarily, be implemented using the dynamic memory replication system 100 shown in FIG. 1. In this particular implementation, the method 1600 begins at optional decision block 1602 in which the operating system 416 or the memory controller 418 determines whether to use the "eager" replication policy. Under certain circumstances the "lazy" replication may be preferred. In other cases the "eager" replication may offer performance benefits. If an "eager" replication policy is not optimal, at block 1604 the operating system 416 will perform the "lazy" replication policy detailed in FIG. 14. However, if an "eager" replication policy is optimal, at block 1606 the operating system 416 will perform the "eager" replication policy detailed in FIG. 15.

Figure 17:
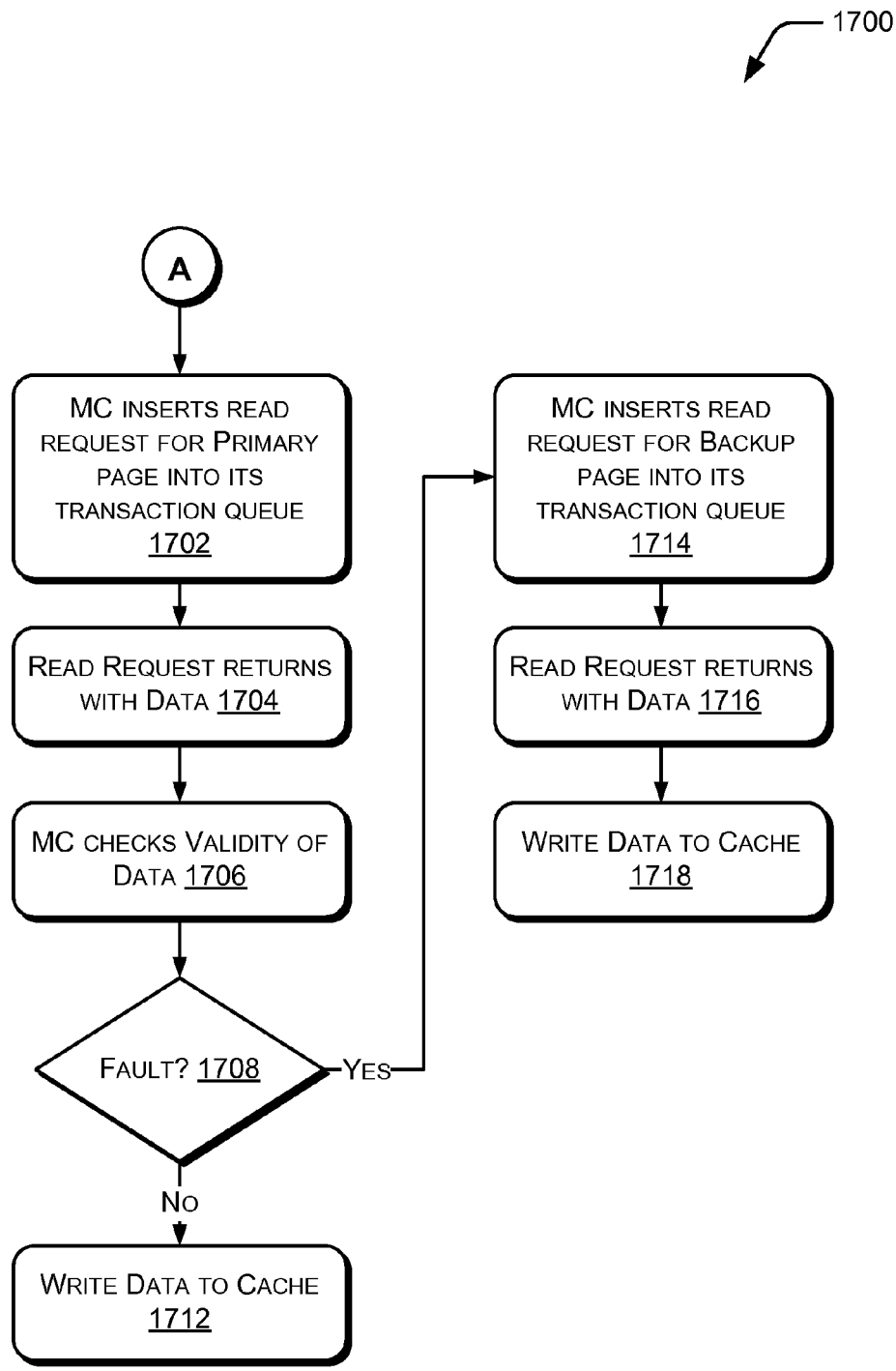
FIG. 17 is a flowchart illustrating details of an illustrative method of implementing a "lazy" replication policy (continued from A in FIG. 16).

FIG. 17 is a flowchart of one illustrative method 1700 for scheduling access to replicated memory pages under a "lazy" replication policy as already described in reference to FIG. 14. The method 1700 may, but need not necessarily, be implemented using the dynamic memory replication system 100 shown in FIG. 1. In this particular implementation, the method 1700 begins at block 1702 where the memory controller 418 inserts a read request for the primary page into its transaction queue. At block 1704, the read request returns with data from the primary page. Because the "lazy" replication policy reads data from the replicated memory pages sequentially, the memory page will be checked for errors prior to inserting the request to read the backup page. Therefore, at block 1706, the memory controller 418 checks the validity of the data returned from the primary page. At decision block 1708, the memory controller 418 determines whether the primary page is faulty. If not, the data are valid and the method terminates at block 1712 by writing the data to a location in memory 402 for consumption by the operating system 416 if necessary. However, if a fault is detected in the primary page, at block 1714 the memory controller 418 inserts a read request for the backup page into its transaction queue. At block 1716, the read request returns with the data from the backup page, and the method terminates at block 1718 by writing the data from the backup page to a location in memory 402 for consumption by the operating system 416 if necessary. In another aspect, the data access being scheduled is a data write. In that case, once both checker-reads return with no errors, the "lazy" replication policy 1400 terminates without writing the data to a location in the memory.

Figure 18:
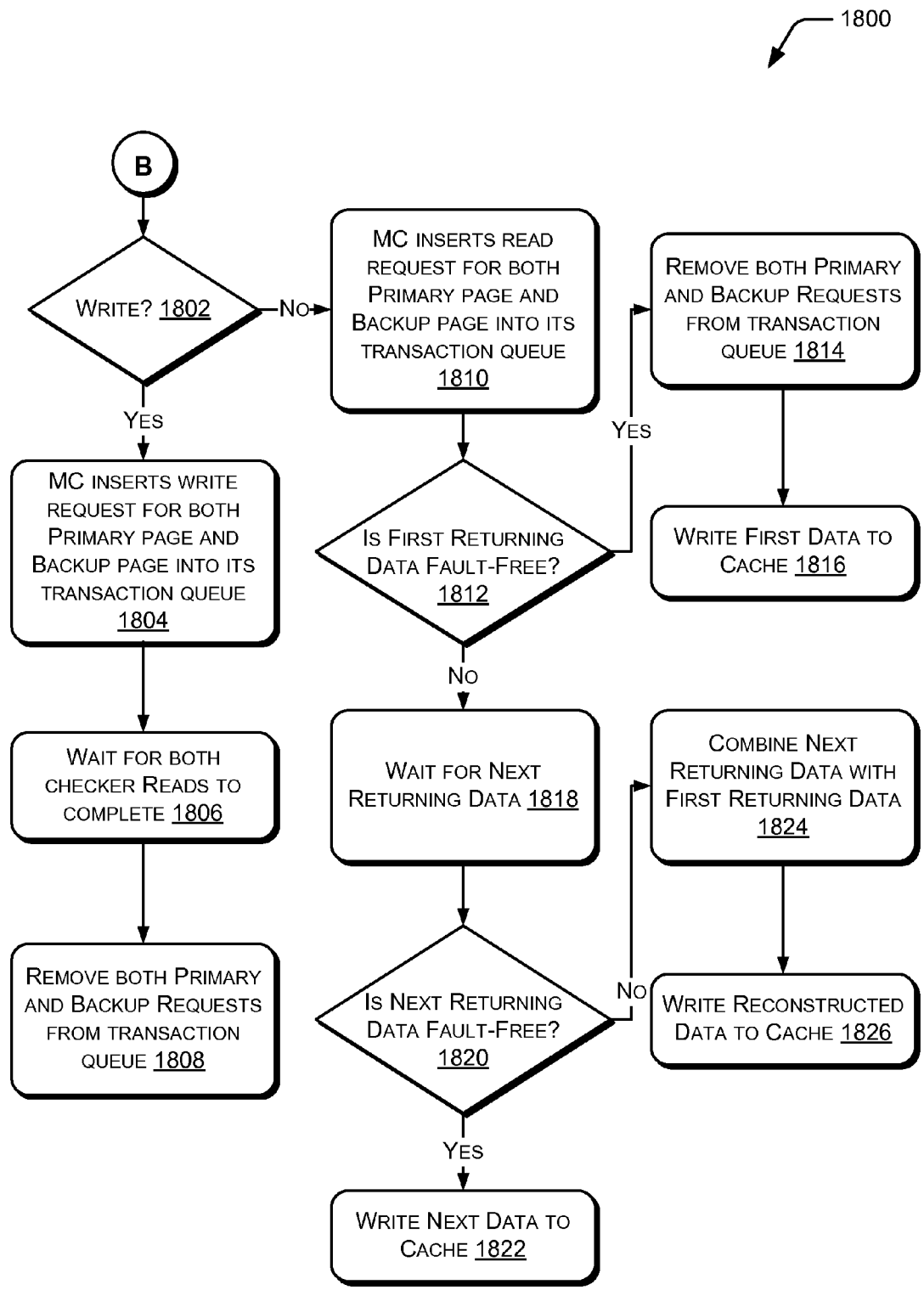
FIG. 18 is a flowchart illustrating details of an illustrative method of implementing an "eager" replication policy (continued from B in FIG. 16).

FIG. 18 is a flowchart of one illustrative method 1800 for scheduling access to replicated memory pages under an "eager" replication policy as already described in reference to FIG. 15. The method 1800 may, but need not necessarily, be implemented using the dynamic memory replication system 100 shown in FIG. 1. In this particular implementation, the method 1800 begins at decision block 1802 where the memory controller 418 determines whether the data access being scheduled is a data write. If so, at block 1804 the memory controller 418 inserts a write request for both the primary page and the backup page into its transaction queue so that both data writes are performed in parallel. At block 1806, the memory controller 418 waits for both checker-reads to complete, and the method terminates at block 1808 by removing both the primary and backup requests from the transaction queue.

On the other hand, at decision block 1802, if memory controller 418 determines that the data access being scheduled is not a write (rather, it is a data read) then at block 1810, memory controller 418 inserts a read request for both the primary page and the backup page into the transaction queue so that both data reads are performed in parallel. At decision block 1812 the memory controller 418 determines whether the first returning set of data is fault-free. The first returning data could be either the data read from the primary memory page or the data read form the backup memory page. In either event, the following steps are the same. If the memory controller 418 determines at decision block 1812 that the first returning data is fault-free, at block 1814 it removes both the primary and backup requests from the transaction queue and the method 1800 terminates at block 1816 by writing the first returning data to a location in memory 104 for further processing.

However, if the memory controller 418 determines at decision block 1812 that the first returning data is not fault-free, at block 1818 it waits for the next returning data. In one aspect, if the first returning data was the data read from the primary memory page then memory controller 418 will be waiting for the data read from the backup memory page. In another aspect, if the first returning data was the data read from the backup memory page then memory controller 418 will be waiting for the data read from the primary memory page.

At decision block 1820, memory controller 418 determines if the next returning data is fault-free. In one aspect, as described above, all data fault checking is done by the data checking method 600. If the next returning data is fault-free, the method 1800 terminates at block 1822 by writing the next returning data to a location in memory for further processing. On the other hand, if the next returning data is not fault-free, the next returning data is combined with the first returning data in order to represent one fault-free page of data at block 1824, and the method 1800 terminates at block 1826 by writing the reconstructed data to a location in memory 104 for further processing.

In one aspect, the location in memory 104 to which data is written whenever method 1800 terminates is a cache in the memory 104 of computer system 102. In another aspect, the location in memory is PRAM, SRAM, DRAM, or main memory. In yet another aspect, the location in memory is not limited to any particular type of memory or architecture.

Illustrative methods of error detection, dynamic memory replication, memory fault recovery, and replicated memory access scheduling are described above. Some or all of these methods may, but need not, be implemented at least partially by an architecture such as that shown in FIG. 4. It should be understood that certain acts in the methods need not be performed in the order described, may be rearranged, modified, and/or may be omitted entirely, depending on the circumstances. Also, any of the acts described above with respect to any method may be implemented by a processor or other computing device based on instructions stored on one or more computer-readable media.

CONCLUSION

The subject matter described above can be implemented in hardware, or software, or in both hardware and software. Although the subject matter has been described in language specific to structural features and/or methodological acts, it is to be understood that the subject matter defined in the appended claims is not necessarily limited to the specific features or acts described above. Rather, the specific features and acts are disclosed as illustrative forms of implementing the claimed subject matter. For example, the methodological acts need not be performed in the order or combinations described herein, and may be performed in any combination of one or more acts.

What is claimed is:

1. A computer implemented method of reclaiming failed memory pages, the method comprising:
    dynamically detecting a plurality of failed memory pages within a memory space, each failed memory page having at least one failed location;
    dynamically pairing a first failed memory page of the plurality of failed memory pages with a second failed memory page of the plurality of failed memory pages, wherein the first failed memory page and the second failed memory page are compatible failed memory pages containing failed memory blocks located in different positions of each of the first and second failed memory pages; and
    responsive to the pairing, creating a useable memory page from the paired first and second failed memory pages that contains no failed memory blocks at each location.

2. The method of claim 1, further comprising:
    writing a plurality of data to the plurality of memory pages having at least one failed location within the memory space prior to discovering the at least one failed location in the plurality of memory pages; and
    writing the plurality of data to useable memory pages in the memory space after discovering the at least one failed location in the plurality of memory pages.

3. The method of claim 1, wherein the pairing further comprises:
    creating a page table for storing a mapping of virtual address spaces to physical address spaces; and
    creating a real table for storing a mapping of physical address spaces to real address spaces.

4. The method of claim 3, wherein the mapping of physical address spaces to real address spaces comprises:
mapping a physical address location to a real address location in the real address space, the real address space comprising:
a pristine memory page containing no failed memory blocks or a a pair of memory pages comprising at least two compatible failed memory pages.

5. The method of claim 3, wherein a first translation lookaside buffer (TLB) data array is extended to accommodate a mapping of a virtual address location to one of the real address locations or a mapping of the virtual address location to at least two of the real address locations.

6. The method of claim 1, wherein the memory space comprises phase change memory.

7. A system comprising:
one or more processors; and
memory storing instructions that when executed by the one or more processors configures the one or more processors to perform acts comprising:
dynamically detecting a plurality of failed memory pages within a memory space, each failed memory page having at least one failed location;
dynamically pairing a first failed memory page of the plurality of failed memory pages with a second failed memory page of the plurality of failed memory pages, wherein the first failed memory page and the second failed memory page are compatible failed memory pages containing failed memory blocks located in different positions of each of the first and second failed memory pages; and
responsive to the pairing, creating a useable memory page from the paired first and second failed memory pages that contains no failed memory blocks at each location.

8. The system of claim 7, the acts further comprising:
writing a plurality of data to the plurality of memory pages having at least one failed location within the memory space prior to discovering the at least one failed location in the plurality of memory pages; and
writing the plurality of data to useable memory pages in the memory space after discovering the at least one failed location in the plurality of memory pages.

9. The system of claim 7, wherein the pairing further comprises:
creating a page table for storing a mapping of virtual address spaces to physical address spaces; and
creating a real table for storing a mapping of physical address spaces to real address spaces.

10. The system of claim 9, wherein the mapping of physical address spaces to real address spaces comprises:
mapping a physical address location to a real address location in the real address space, the real address space comprising:
a pristine memory page containing no failed memory blocks or a pair of memory pages comprising at least two compatible failed memory pages.

11. The system of claim 9, wherein a first translation lookaside buffer (TLB) data array is extended to accommodate a mapping of a virtual address location to one of the real address locations or a mapping of the virtual address location to at least two of the real address locations.

12. The system of claim 7, wherein the memory space comprises phase change memory.

13. One or more computer-readable storage media, storing computer-executable instructions that, when executed, configure a processor to perform acts for detecting and reliably recording memory faults, the acts comprising:
dynamically detecting a plurality of failed memory pages within a memory space, each failed memory page having at least one failed location;
dynamically pairing a first failed memory page of the plurality of failed memory pages with a second failed memory page of the plurality of failed memory, wherein the first failed memory page and the second failed memory page are compatible failed memory pages containing failed memory blocks located in different positions of each of the first and second failed memory pages; and
responsive to the pairing, creating a useable memory page from the paired first and second failed memory pages that contains no failed memory blocks at each location.

14. The one or more computer-readable storage media of claim 13, the acts further comprising:
writing a plurality of data to the plurality of memory pages having at least one failed location within the memory space prior to discovering the at least one failed location in the plurality of memory pages; and
writing the plurality of data to useable memory pages in the memory space after discovering the at least one failed location in the plurality of memory pages.

15. The one or more computer-readable storage media of claim 13, wherein the pairing further comprises:
creating a page table for storing a mapping of virtual address spaces to physical address spaces; and
creating a real table for storing a mapping of physical address spaces to real address spaces.

16. The one or more computer-readable storage media of claim 15, wherein the mapping of physical address spaces to real address spaces comprises:
mapping a physical address location to a real address location in the real address space, the real address space comprising:
a pristine memory page containing no failed memory blocks or a pair of memory pages comprising at least two compatible failed memory pages.

17. The one or more computer-readable storage media of claim 15, wherein a first translation lookaside buffer (TLB) data array is extended to accommodate a mapping of a virtual address location to one of the real address locations or a mapping of the virtual address location to at least two of the real address locations.

18. The one or more computer-readable storage media of claim 13, wherein the memory space comprises phase change memory.

* * * * *